United States Patent
Hoen et al.

(10) Patent No.: US 10,088,937 B2
(45) Date of Patent: Oct. 2, 2018

(54) TOUCH INPUT DEVICE INCLUDING A MOMENT COMPENSATED BENDING SENSOR FOR LOAD MEASUREMENT ON PLATFORM SUPPORTED BY BENDING BEAMS

(71) Applicant: Apple Inc., Cupertino, CA (US)

(72) Inventors: Storrs T. Hoen, Cupertino, CA (US); Peteris K. Augenbergs, Cupertino, CA (US); John M. Brock, San Carlos, CA (US); Jonah A. Harley, Cupertino, CA (US); Sam Rhea Sarcia, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 555 days.

(21) Appl. No.: 14/398,720

(22) PCT Filed: Mar. 15, 2013

(86) PCT No.: PCT/US2013/031816
§ 371 (c)(1),
(2) Date: Nov. 3, 2014

(87) PCT Pub. No.: WO2013/165601
PCT Pub. Date: Nov. 7, 2013

(65) Prior Publication Data
US 2015/0116260 A1    Apr. 30, 2015

Related U.S. Application Data

(60) Provisional application No. 61/642,423, filed on May 3, 2012.

(51) Int. Cl.
*G06F 3/041*    (2006.01)
*G01L 1/22*    (2006.01)
(Continued)

(52) U.S. Cl.
CPC .............. *G06F 3/0414* (2013.01); *G01L 1/22* (2013.01); *G06F 3/03547* (2013.01);
(Continued)

(58) Field of Classification Search
CPC .. G09G 3/00; G09G 3/22; G09G 5/006; H01J 29/98; H01J 31/127; G06F 3/0412;
(Continued)

(56) References Cited

U.S. PATENT DOCUMENTS 3,745,502 A    7/1973  Watanabe
3,876,912 A    4/1975  Sanders
(Continued)

FOREIGN PATENT DOCUMENTS

CN    1527933 A    9/2004
CN    1796955      7/2006
(Continued)

OTHER PUBLICATIONS

Bau, et al., "TeslaTouch: Electrovibration for Touch Surfaces," UIST'10, Oct. 3-6, 2010, New York, New York USA, 10 pages.
(Continued)

*Primary Examiner* — Harshad R Patel
*Assistant Examiner* — Brandi Hopkins
(74) *Attorney, Agent, or Firm* — Brownstein Hyatt Farber Schreck, LLP

(57) ABSTRACT

A method is provided for fabricating a bending beam sensor coupled to a touch input device. The method includes providing a bending beam. The method also includes placing a first strain gauge and a second strain gauge on a surface of the beam near a first end of the beam, and aligning the first strain gauge and the second strain gauge with the beam along an axis. The first end is attached to a base. The method further includes coupling the first strain gauge and the second strain gauge to a plate of the touch input device and
(Continued)

electrically connecting the first strain gauge and the second strain gauge such that a differential signal is obtained from the first strain gauge and the second strain gauge when a load is applied on the plate of the touch input device.

18 Claims, 21 Drawing Sheets

(51) Int. Cl.
   *H05K 13/00* (2006.01)
   *G06F 3/0354* (2013.01)
   *G06F 3/044* (2006.01)

(52) U.S. Cl.
   CPC .............. *G06F 3/044* (2013.01); *H05K 13/00* (2013.01); *G06F 2203/0338* (2013.01); *G06F 2203/04103* (2013.01); *G06F 2203/04104* (2013.01); *G06F 2203/04105* (2013.01); *Y10T 29/49117* (2015.01)

(58) Field of Classification Search
   CPC ......... G06F 2203/04105; G06F 3/0414; G06F 3/045; G06F 3/016; G06F 3/0416; G06F 1/1662; G06F 1/1692; G06F 3/041; G06F 2203/04104; G06F 1/1613; G06F 3/044; G06F 3/0227; G06F 3/03547; G01G 3/1414; G01G 3/1412; G01N 19/02; G01N 2203/0286; G01Q 60/366; B82Y 35/00
   USPC .......... 345/214, 74.1, 174; 631/829; 73/767, 73/862.338, 862.639, 628, 1.13
   See application file for complete search history.

(56) References Cited

U.S. PATENT DOCUMENTS

| | | | |
|---|---|---|---|
| 4,345,477 A | 8/1982 | Johnson | |
| 4,423,640 A * | 1/1984 | Jetter | G01G 3/1412 338/5 |
| 4,516,112 A | 5/1985 | Chen | |
| 4,634,917 A | 1/1987 | Dvorsky et al. | |
| 4,695,963 A | 9/1987 | Sagisawa | |
| 4,951,510 A * | 8/1990 | Holm-Kennedy | G01P 15/0802 73/510 |
| 5,481,905 A | 1/1996 | Pratt | |
| 5,673,041 A | 9/1997 | Chatigny et al. | |
| 5,708,460 A | 1/1998 | Young | |
| 5,915,285 A | 6/1999 | Sommer | |
| 6,288,829 B1 | 9/2001 | Kimura | |
| 6,369,865 B2 | 4/2002 | Hinata | |
| 6,386,023 B1 | 4/2002 | Sajna et al. | |
| 6,812,161 B2 | 11/2004 | Heremans | |
| 6,973,837 B2 | 12/2005 | Barnett | |
| 7,154,481 B2 | 12/2006 | Cross et al. | |
| 7,176,897 B2 | 2/2007 | Roberts | |
| 7,190,350 B2 | 3/2007 | Roberts | |
| 7,196,694 B2 | 3/2007 | Roberts | |
| 7,211,885 B2 | 5/2007 | Nordal et al. | |
| 7,331,245 B2 | 2/2008 | Nishimura | |
| 7,392,716 B2 | 7/2008 | Wilner | |
| 7,441,467 B2 | 10/2008 | Bloom | |
| 7,456,823 B2 | 11/2008 | Poupyrev et al. | |
| 7,511,702 B2 | 3/2009 | Hotelling | |
| 7,538,760 B2 | 5/2009 | Hotelling et al. | |
| 7,707,894 B2 | 5/2010 | Sumigawa | |
| 7,724,248 B2 | 5/2010 | Saito | |
| 7,726,199 B2 | 6/2010 | Shkel et al. | |
| 7,755,616 B2 | 7/2010 | Jung et al. | |
| 7,800,592 B2 | 9/2010 | Kerr et al. | |
| 7,903,091 B2 | 3/2011 | Lee | |
| 7,992,448 B2 | 8/2011 | Shimazu | |
| 8,020,456 B2 | 9/2011 | Liu et al. | |
| 8,050,876 B2 | 11/2011 | Feen et al. | |
| 8,056,421 B2 | 11/2011 | Sumigawa | |
| 8,077,154 B2 | 12/2011 | Emig et al. | |
| 8,132,468 B2 | 3/2012 | Radivojevic | |
| 8,243,225 B2 | 8/2012 | Kai et al. | |
| 8,266,971 B1 | 9/2012 | Jones | |
| 8,305,358 B2 | 11/2012 | Klighhult et al. | |
| 8,421,483 B2 | 4/2013 | Klinghult et al. | |
| 8,434,369 B2 | 5/2013 | Hou et al. | |
| 8,456,430 B2 | 6/2013 | Oliver et al. | |
| 8,482,545 B2 | 7/2013 | King-Smith et al. | |
| 8,519,974 B2 | 8/2013 | Berggren | |
| 8,531,429 B2 | 9/2013 | Chang | |
| 8,605,053 B2 | 12/2013 | Murphy et al. | |
| 8,640,549 B2 | 2/2014 | Inamori | |
| 8,648,816 B2 | 2/2014 | Homma et al. | |
| 8,669,952 B2 | 3/2014 | Hashimura et al. | |
| 8,669,962 B2 | 3/2014 | Kuan | |
| 8,692,646 B2 | 4/2014 | Lee et al. | |
| 8,695,433 B2 | 4/2014 | Shimazu | |
| 8,711,128 B2 | 4/2014 | Small et al. | |
| 8,780,060 B2 | 7/2014 | Maschmeyer et al. | |
| 8,780,074 B2 | 7/2014 | Castillo et al. | |
| 8,780,543 B2 | 7/2014 | Molne et al. | |
| 8,870,087 B2 | 10/2014 | Coogan et al. | |
| 8,878,803 B2 | 11/2014 | Kimura et al. | |
| 8,982,088 B2 | 3/2015 | Kung | |
| 8,988,384 B2 | 3/2015 | Krah et al. | |
| 9,007,333 B1 | 4/2015 | Wilson | |
| 9,057,653 B2 | 4/2015 | Schediwy | |
| 9,024,910 B2 | 5/2015 | Stephanou et al. | |
| 9,024,918 B2 | 5/2015 | Cok | |
| 9,030,427 B2 | 5/2015 | Yasumatsu | |
| 9,063,599 B2 | 6/2015 | Yanagi et al. | |
| 9,081,460 B2 | 7/2015 | Jeong et al. | |
| 9,099,971 B2 | 8/2015 | Lynn et al. | |
| 9,110,532 B2 | 8/2015 | Ando et al. | |
| 9,116,569 B2 | 8/2015 | Stacy et al. | |
| 9,116,570 B2 | 8/2015 | Lee et al. | |
| 9,128,547 B2 | 9/2015 | Kodani et al. | |
| 9,134,826 B2 | 9/2015 | Andoh | |
| 9,158,407 B2 | 10/2015 | Coulson | |
| 9,182,849 B2 | 11/2015 | Huang et al. | |
| 9,182,859 B2 | 11/2015 | Coulson et al. | |
| 9,200,970 B2 | 12/2015 | Kodani et al. | |
| 9,223,162 B2 | 12/2015 | DeForest et al. | |
| 9,246,486 B2 | 1/2016 | Yang et al. | |
| 9,262,002 B2 | 2/2016 | Momeyer et al. | |
| 9,292,115 B2 | 3/2016 | Kauhanen et al. | |
| 9,304,348 B2 | 4/2016 | Jang | |
| 9,329,719 B2 | 5/2016 | Molne et al. | |
| 9,360,977 B2 | 6/2016 | Aberg | |
| 9,367,173 B2 | 6/2016 | Setlak | |
| 9,383,848 B2 | 7/2016 | Daghigh | |
| 9,417,696 B2 | 8/2016 | DeLuca | |
| 9,417,725 B1 | 8/2016 | Watazu et al. | |
| 9,454,268 B2 | 9/2016 | Badaye et al. | |
| 9,459,734 B2 | 10/2016 | Day | |
| 9,466,783 B2 | 10/2016 | Olien et al. | |
| 9,501,167 B2 | 11/2016 | Day | |
| 9,507,456 B2 | 11/2016 | Watazu et al. | |
| 9,519,378 B2 | 12/2016 | Watazu et al. | |
| 9,542,028 B2 | 1/2017 | Filiz et al. | |
| 9,557,857 B2 | 1/2017 | Schediwy | |
| 9,563,317 B2 | 2/2017 | Sleeman et al. | |
| 9,612,170 B2 | 4/2017 | Vosgueritchian et al. | |
| 9,639,224 B2 | 5/2017 | Lee | |
| 9,658,722 B2 | 5/2017 | Schwartz | |
| 9,665,200 B2 | 5/2017 | Filiz et al. | |
| 9,690,408 B1 | 6/2017 | Krah | |
| 9,690,414 B2 | 6/2017 | Kano et al. | |
| 9,729,730 B2 | 8/2017 | Levesque et al. | |
| 9,791,968 B2 | 10/2017 | Yang | |
| 9,841,850 B2 | 12/2017 | Schediwy et al. | |
| 9,864,450 B2 | 1/2018 | Watazu et al. | |
| 9,881,577 B2 | 1/2018 | Wang et al. | |
| 9,916,942 B2 | 3/2018 | Shedletsky | |
| 10,007,380 B2 | 6/2018 | Yoon et al. | |

(56) References Cited

U.S. PATENT DOCUMENTS

| | | |
|---|---|---|
| 10,032,592 B2 | 7/2018 | Brooks et al. |
| 2002/0149571 A1 | 10/2002 | Roberts |
| 2006/0043508 A1 | 3/2006 | Ohta et al. |
| 2007/0159561 A1 | 7/2007 | Chien |
| 2008/0165159 A1* | 7/2008 | Soss ............... G06F 3/0414 345/174 |
| 2008/0218488 A1 | 9/2008 | Yang et al. |
| 2009/0002199 A1 | 1/2009 | Lainonen et al. |
| 2009/0189866 A1 | 7/2009 | Haffenden et al. |
| 2009/0316380 A1 | 12/2009 | Armstrong |
| 2010/0053116 A1 | 3/2010 | Daverman et al. |
| 2010/0103115 A1 | 4/2010 | Hainzl |
| 2010/0117809 A1 | 5/2010 | Dai et al. |
| 2010/0123686 A1 | 5/2010 | Klinghult et al. |
| 2011/0045285 A1 | 2/2011 | Saiki et al. |
| 2011/0248839 A1 | 10/2011 | Kwok et al. |
| 2011/0261021 A1 | 10/2011 | Modarres et al. |
| 2011/0285660 A1 | 11/2011 | Prabhu et al. |
| 2012/0019448 A1 | 1/2012 | Pitkanen et al. |
| 2012/0038577 A1 | 2/2012 | Brown et al. |
| 2012/0105367 A1 | 5/2012 | Son et al. |
| 2012/0127136 A1 | 5/2012 | Schneider et al. |
| 2012/0154299 A1 | 6/2012 | Hsu et al. |
| 2012/0139864 A1 | 7/2012 | Sleeman et al. |
| 2012/0188198 A1 | 7/2012 | Jeong et al. |
| 2012/0293491 A1 | 11/2012 | Wang et al. |
| 2013/0074988 A1 | 3/2013 | Chou |
| 2013/0082970 A1 | 4/2013 | Frey et al. |
| 2013/0141365 A1 | 6/2013 | Lynn et al. |
| 2013/0147739 A1 | 6/2013 | Aberg et al. |
| 2013/0154933 A1 | 6/2013 | Sheik-Nainar |
| 2013/0215056 A1 | 8/2013 | Johansson et al. |
| 2013/0222306 A1 | 8/2013 | Aberg et al. |
| 2013/0328803 A1 | 12/2013 | Fukushima et al. |
| 2013/0333922 A1 | 12/2013 | Kai et al. |
| 2014/0085253 A1 | 3/2014 | Leung et al. |
| 2014/0118635 A1 | 5/2014 | Yang |
| 2014/0174190 A1 | 6/2014 | Kulkarni et al. |
| 2014/0191973 A1 | 7/2014 | Zellers et al. |
| 2014/0327847 A1 | 11/2014 | Park et al. |
| 2015/0002452 A1 | 1/2015 | Klinghult |
| 2015/0101849 A1 | 4/2015 | Bockmeyer et al. |
| 2015/0242037 A1 | 8/2015 | Pedder et al. |
| 2015/0268725 A1 | 9/2015 | Levesque et al. |
| 2015/0301684 A1 | 10/2015 | Shimamura |
| 2015/0331517 A1 | 11/2015 | Filiz et al. |
| 2016/0003697 A1 | 1/2016 | Okamoto et al. |
| 2016/0033389 A1 | 2/2016 | Serpe |
| 2016/0034073 A1 | 2/2016 | Andoh |
| 2016/0035037 A1 | 2/2016 | Kim et al. |
| 2016/0041672 A1 | 2/2016 | Hoen et al. |
| 2016/0048266 A1 | 2/2016 | Smith et al. |
| 2016/0062517 A1 | 3/2016 | Meyer et al. |
| 2016/0077649 A1 | 3/2016 | Ando et al. |
| 2016/0117035 A1 | 4/2016 | Watazu et al. |
| 2016/0132151 A1 | 5/2016 | Watazu et al. |
| 2016/0147353 A1 | 5/2016 | Filiz et al. |
| 2016/0306481 A1 | 10/2016 | Filiz et al. |
| 2016/0357297 A1 | 12/2016 | Picciotto et al. |
| 2017/0031495 A1 | 2/2017 | Smith |
| 2017/0075465 A1 | 3/2017 | Pedder et al. |
| 2017/0090638 A1 | 3/2017 | Vosgueritchian et al. |
| 2017/0090655 A1 | 3/2017 | Zhang et al. |
| 2017/0191884 A1 | 7/2017 | Vosgueritchian et al. |
| 2017/0261387 A1 | 9/2017 | Vosgueritchian et al. |
| 2017/0269757 A1 | 9/2017 | Filiz et al. |
| 2017/0285864 A1 | 10/2017 | Pedder et al. |
| 2018/0059839 A1 | 3/2018 | Kim et al. |
| 2018/0074638 A1 | 3/2018 | Chiang et al. |

FOREIGN PATENT DOCUMENTS

| | | |
|---|---|---|
| CN | 1860432 | 11/2006 |
| CN | 101017419 | 8/2007 |
| CN | 101071354 | 11/2007 |
| CN | 101201277 A | 6/2008 |
| CN | 101243383 | 8/2008 |
| CN | 101950224 | 1/2011 |
| CN | 102012772 | 4/2011 |
| CN | 102047088 | 5/2011 |
| CN | 102165400 | 8/2011 |
| CN | 102175362 A | 9/2011 |
| CN | 102368191 | 3/2012 |
| CN | 102460351 | 5/2012 |
| CN | 102591519 | 7/2012 |
| CN | 102822779 | 12/2012 |
| CN | 103026327 | 4/2013 |
| CN | 103069365 | 4/2013 |
| CN | 103197821 | 7/2013 |
| CN | 103336562 | 10/2013 |
| CN | 103582807 | 2/2014 |
| CN | 204461655 U | 7/2015 |
| CN | 204576454 U | 8/2015 |
| CN | 105444662 | 3/2016 |
| EP | 0332365 | 9/1989 |
| EP | 0467562 | 1/1992 |
| EP | 1840714 | 10/2007 |
| EP | 2120136 | 11/2009 |
| EP | 2381340 | 10/2011 |
| EP | 2629075 | 8/2013 |
| FR | 2907563 | 4/2008 |
| JP | 201039458 A | 2/2010 |
| JP | 2010197066 | 9/2010 |
| WO | WO 96/038833 | 12/1996 |
| WO | WO 02/035461 | 5/2002 |
| WO | WO 07/074800 | 7/2007 |
| WO | WO 08/076393 | 6/2008 |
| WO | WO 11/156447 | 12/2011 |
| WO | WO 12/168892 | 12/2012 |
| WO | WO 13/177322 | 11/2013 |
| WO | WO 15/106183 | 7/2015 |
| WO | WO 15/158952 | 10/2015 |
| WO | WO 16/029354 | 3/2016 |

OTHER PUBLICATIONS

Feist, "Samsung snags patent for new pressure sensitive touchscreens," posted on AndroidAuthority.com at URL: http://www.androidauthority.com/samsung-patent-pressure-sensitive-touchscreens-354860, Mar. 7, 2014, 1 page.

Rausch, "Printed piezoresistive strain sensors for monitoring of light-weight structures," Sensor+Test Conferences 2011—Sensor Proceedings, pp. 216-220.

Schweizer, "Electrical characterization and investigation of the piezoresistive effect of PEDOT:PSS thin films," A Thesis Presented to the Academic Faculty in Partial Fulfillment of the Requirements for the Degree Master of Science of Electrical and Computer Engineering, Georgia Institute of Technology, Apr. 2005, 89 pages.

Takamatsu, et al., "Transparent conductive-polymer strain sensors for touch input sheets of flexible displays," *Journal of Micromechanics and Microengineering*, vol. 20, 2010, 6 pages.

Tsai, et al., "Fabrication of Graphene-based Micro Strain Gauge," NPL Management Ltd.—Internal, Oct. 15-16, 2012, 1 page.

\* cited by examiner

TOUCH INPUT DEVICE INCLUDING A MOMENT COMPENSATED BENDING SENSOR FOR LOAD MEASUREMENT ON PLATFORM SUPPORTED BY BENDING BEAMS

CROSS REFERENCE TO RELATED APPLICATIONS

This Patent Cooperation Treaty patent application claims priority to U.S. provisional application No. 61/642,423, filed May 3, 2012, and entitled, "Moment Compensated Bending Beam Sensor For Load Measurement On Platform Supported By Bending Beams," the contents of which are incorporated herein by reference in its entirety.

TECHNICAL FIELD

The present invention generally relates to method and sensors for measuring forces on a trackpad or other surface, such as a computing input device.

BACKGROUND

A force sensor, such as a bending beam sensor, measures a force exerted by an object on a surface to which the sensor is affixed. A standard bending beam strain sensor has an output that is large enough to be easily measured with readily available components. The bending beam sensor may include a strain gauge that measures strain generated by the force. Generally, the greater the force, the greater the generated strain. Thus, the strain gauge may be used to indirectly measure and compute the force exerted by a load on the beam, or an object attached to the beam.

However, in some cases a typical bending beam strain sensor may prove inadequate for measuring an exerted force. In the case of a plate supported by multiple beams, for example, it is possible that a force exerted on the plate may be measured inaccurately by a bending beam sensor due to a moment of the force. That is, when a force or load is applied to the plate, the strain measured by the standard bending beam strain sensor depends on the position of the force or load on the trackpad or plate and also the connection between the plate and the bending beam. This may prove problematic in certain mechanisms, such as a force-sensitive input device for a computing device. Examples of such input devices may include trackpads, buttons, keys on a keyboard, pressure-sensitive touch screens and so forth.

Thus, there remains a need for developing methods and device for load measurements on platforms supported with bending beams.

SUMMARY

Embodiments described herein may provide moment compensated bending beam sensors for load measurements on platforms supported by bending beams. The disclosure provides methods for measuring the load on the platforms.

In one embodiment, a method is provided for fabricating a bending beam sensor coupled to a touch input device. The method may include, for example, providing a bending beam, placing a first strain gauge and a second strain gauge on a surface of the beam near a first end of the beam, and aligning the first strain gauge and the second strain gauge with the beam along an axis. The first end typically is attached to a base. The method may employ a first strain gauge and a second strain gauge that are both electrically connected such that a differential signal is obtained from the first strain gauge and the second strain gauge when a load is applied on the plate of the touch input device.

In another embodiment, a method is provided for fabricating a touch input device coupled with bending beam sensors. The method includes providing at least three bending beams. The method also includes placing a first bending beam sensor on a surface of the first bending beam and aligning the first bending beam sensor with the first beam between a first end and a second free end of the first beam, the first end of the first beam attached to a first beam base. The method further includes placing a second bending beam sensor on a surface of the second bending beam and aligning the second bending beam sensor with the second beam between a first end and a second free end of the second beam, the first end of the second beam attached to a second beam base. The method also includes placing a third bending beam sensor on a surface of the third bending beam and aligning the third bending beam sensor with the third beam between a first end and a second free end of the third beam, the first end of the third beam attached to a third beam base. The method further includes coupling the first, second, and third bending beam sensors to a plate of the touch input device and electrically connecting each of the first, second, and third bending beam sensors to output signals to a processor.

In yet another embodiment, a moment compensated bending beam sensor device is provided for a plate coupled to a bending beam. The plate is configured for applying a force on a top surface of the plate. The sensor device includes a bending beam having a first end attached to a beam base. The sensor device also includes a bending beam sensor attached to the bending beam. The bending beam sensor includes a first strain gauge and a second strain gauge, each strain gauge being aligned with the bending beam and being placed between the first end and the second free end.

In still yet another embodiment, a touch input device is provided. The input device includes a plate configured for applying a force on a top surface of the plate. The input device also includes a position sensor attached to the plate. The input device also includes four bending beams coupled to the plate and the position sensor, each bending beam having a first end attached to a beam base. The input device further includes a bending beam sensor attached to each bending beam. Each bending beam sensor includes a first pair of strain gauges and a second pair of strain gauges being aligned with the bending beam and placed between the first end and the second free end, and the first pair of strain gauges and the second pair of strain gauges.

In a further embodiment, a method is provided for determining a force and a location of the force on a plate. The method includes sensing a voltage change at a first strain gauge and a second strain gauge. The first and the second strain gauges are positioned on a common side of a single beam coupled to the plate. The method also includes obtaining a differential voltage between the first strain gauge and the second strain gauge. The method further includes transmitting the differential voltage to a processor; and converting the differential voltage to a force on the plate.

In yet a further embodiment, a touch input device is provided. The input device includes a platform, at least one bending beam supporting the platform. The input device also includes at least one force sensor disposed on the at least one bending beam. The force sensor is operative to measure a force exerted on the platform. The at least one force sensor is operative to output at least three distinct force levels.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings, which forms a part of this disclosure.

DETAILED DESCRIPTION

Figure 1A:
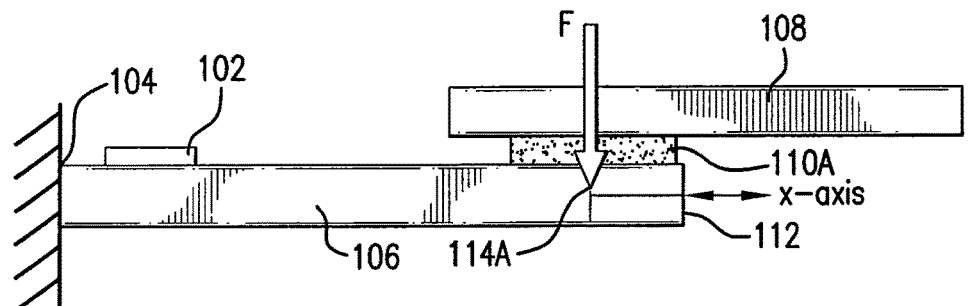
FIGS. 1A-1C illustrate a standard bending beam strain sensor for load measurement in several configurations.

The present disclosure may be understood by reference to the following detailed description, taken in conjunction with the drawings as briefly described below. It is noted that, for purposes of illustrative clarity, certain elements in the drawings may not be drawn to scale.

Generally, embodiments discussed herein may take the form of a sensor for determining a load or force, or structures that operate with such sensors. As one example, a trackpad may be associated with one or more force sensor, as discussed herein. As force is applied to the trackpad, the sensor(s) may detect a strain. That strain may be correlated to the force exerted on the trackpad and thus an amount of force exerted may be determined. Further, by employing multiple sensors in appropriate configurations, a location at which a force is applied may be determined in addition to a magnitude of the force.

Some embodiments may permit the detection of multiple forces at multiple locations.

Further, it should be appreciated that such forces may be used as inputs to a computing device. That is, by measuring a force, the force may be treated as an input to a computing system and the input may vary with the degree of force applied. Thus, input/output devices may accept non-binary inputs through the use of strain sensors, as discussed herein. In addition, embodiments may be used in or as a variety of different input/output mechanisms. For example, strain (and thus force) may be measured on a variety of input surfaces in accordance with embodiments discussed herein. Thus, various surfaces may be used as an input to a variety of computing devices, such as laptop and/or desktop computers, smart phones, tablet devices, touch pads, dashboards, control buttons and switches, and so on.

Figure 1B:
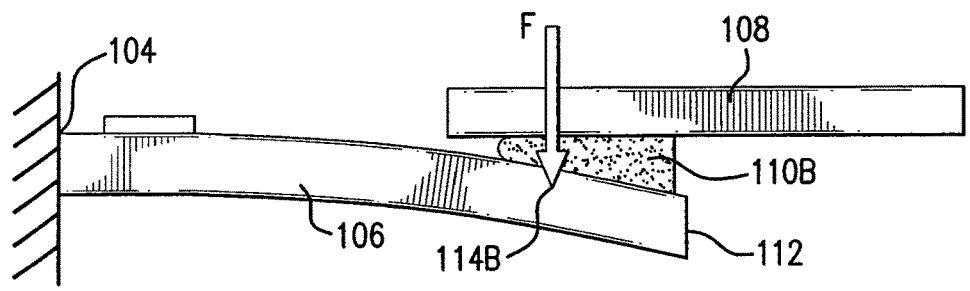
Figure 1C:
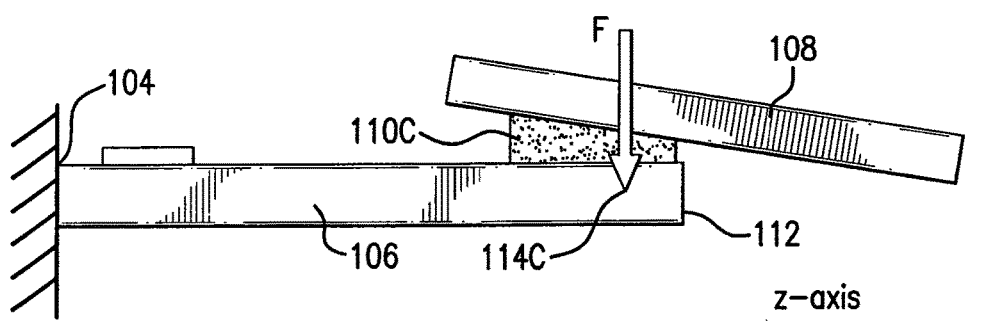

FIGS. 1A-1C illustrate a bending beam strain sensor on a beam and used for load measurement; each of FIGS. 1A-1C illustrates the beam sensor and beam in several configurations when load position varies along the beam. The beams may be used to support a force-sensitive trackpad, for example.

FIG. 1A shows that a standard bending beam strain sensor 102 is placed near a beam base 104 of a beam 106 and positioned horizontally along an X-axis. The standard bending beam strain sensor 102 is oriented so it responds to strain along the X-axis. In the embodiment, a trackpad 108 is substantially parallel to the beam 106 and a sensor 102 aligned with an axis of the beam. This axis is labeled as the "X-axis" in the figure. The trackpad 108 is attached to the bending beam 106 through a gel 110

Still with reference to FIG. 1A, a load is vertically applied through a center 114C of the gel 110 along a Z-axis. In this case, the gel layer 110A has a uniform thickness but in alternative embodiments the gel may non-uniform or differently shaped. The trackpad 108 may be a platform or a plate.

As shown in FIG. 1B, as the force is applied, the gel is compressed toward the beam base 104. The beam 106 is bent such that the force is applied through the gel 110B at a force location 114B closer to the beam base 104 than force location 114A.

Referring now to FIG. 1C, the gel is compressed near a free end or edge 112 such that the force is applied through the gel 110C at a force location 114C closer to the free end 112 than force location 114A. The strain detected at strain sensor 102 depends on both the magnitude of the applied force and the position of the force along the beam as well as any additional moments applied to the beam. Because the position of the applied force F can change, as illustrated in FIGS. 1A-1C, the standard bending beam strain sensor 102 has a non-uniform response to the position 114 of the load or force.

Figure 2:
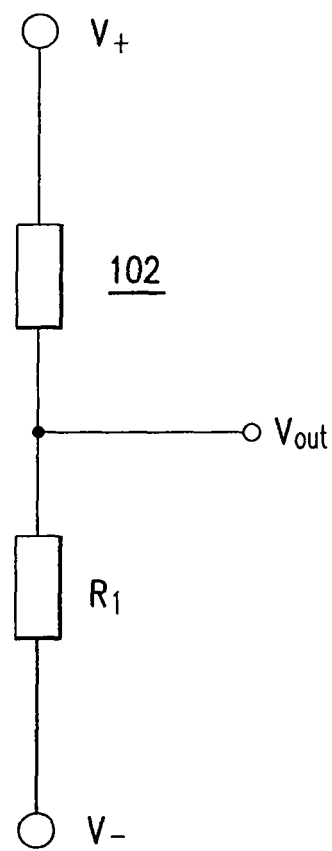
FIG. 2 illustrates a circuit diagram for a standard bending beam strain sensor.

FIG. 2 shows a circuit diagram for a standard bending beam strain sensor 102 including one strain gauge, in accordance with one embodiment. Strain gage 51 and one constant resistor are connected as shown; this configuration is commonly called a half-bridge. The resistor $R_1$ is chosen to be nearly equal to the resistance of the standard bending beam strain sensor 102 so that the output voltage $V_{out}$ generally lies midway between $V_+$ and $V_-$. When a force is applied to the beam as shown in FIG. 1B, the beam is bent and a strain is generated at the standard bending beam strain sensor 102, which in turn changes the resistance of the standard bending beam strain sensor 102 and thus the output voltage $V_{out}$.

Figure 1D:
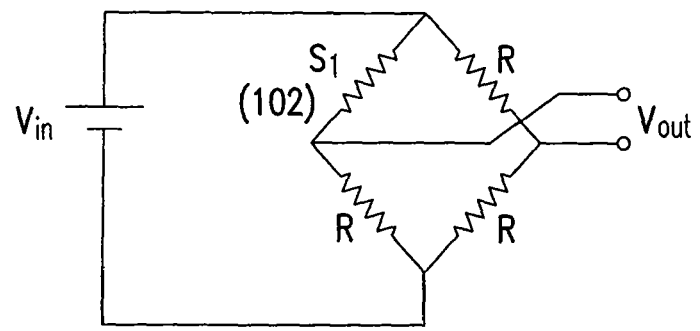
FIG. 1D shows a circuit diagram for a standard bending beam strain sensor including one strain gauge.

FIG. 1D shows a circuit diagram for a standard bending beam strain sensor 102 including one strain gauge in one embodiment. Strain gauge S1 and three constant resistors R are connected in a full Wheatstone bridge. When a voltage supply $V_{in}$ is applied, an output voltage $V_{out}$ is generated. When the beam is bent, a strain is generated which changes the resistance of standard bending beam strain sensor 102 and changes the output voltage $V_{out}$.

Figure 1E:
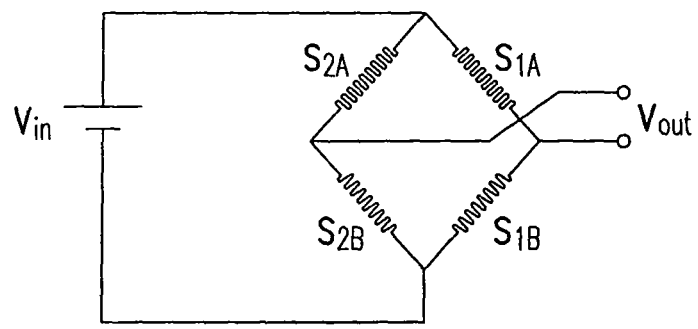
FIG. 1E shows a circuit diagram for a standard bending beam strain sensor including four strain gauges.
Figure 1E:
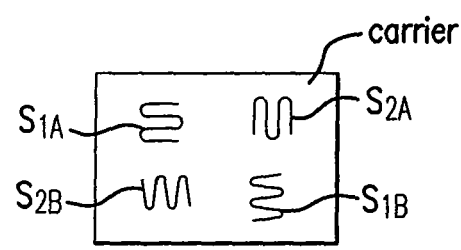

FIG. 1E shows a circuit diagram for a standard bending beam strain sensor including four strain gauges in another embodiment. The standard bending beam strain sensor may include four strain gauges S1A, S1B, S2A, and S2B electrically connected in a full Wheatstone bridge. The strain gauges are arranged as shown in FIG. 1E. The strain sensors are co-located such that S1A and S1B detect the strain parallel to the x-axis and S2A and S2B detect the Poisson strain generated by the strain parallel to the x-axis. Again, when a voltage supply $V_{in}$ is applied, an output voltage $V_{out}$ is generated.

Figure 3A:
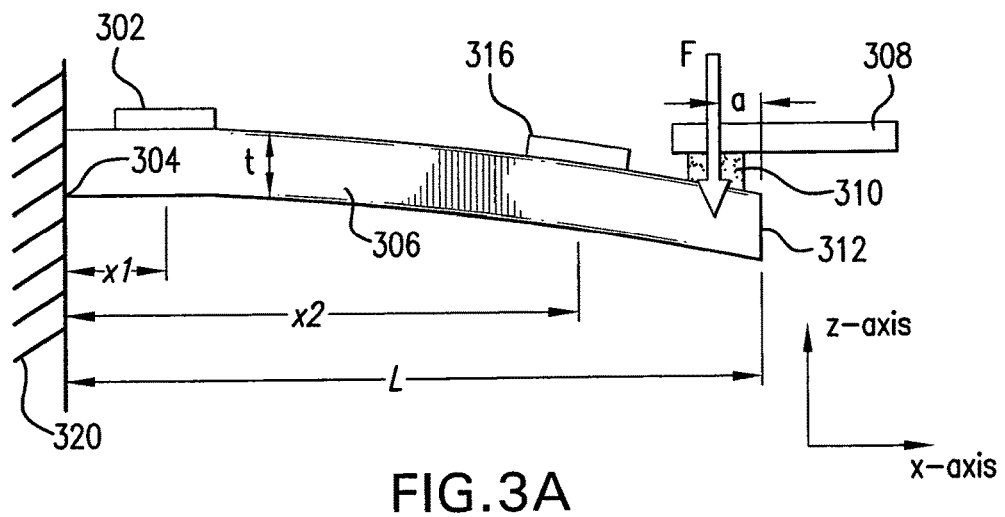
FIG. 3A illustrates a moment compensated bending beam sensor including two strain gauges or two pairs of strain gauges on one side of a beam for load measurement in an embodiment.
Figure 3B:
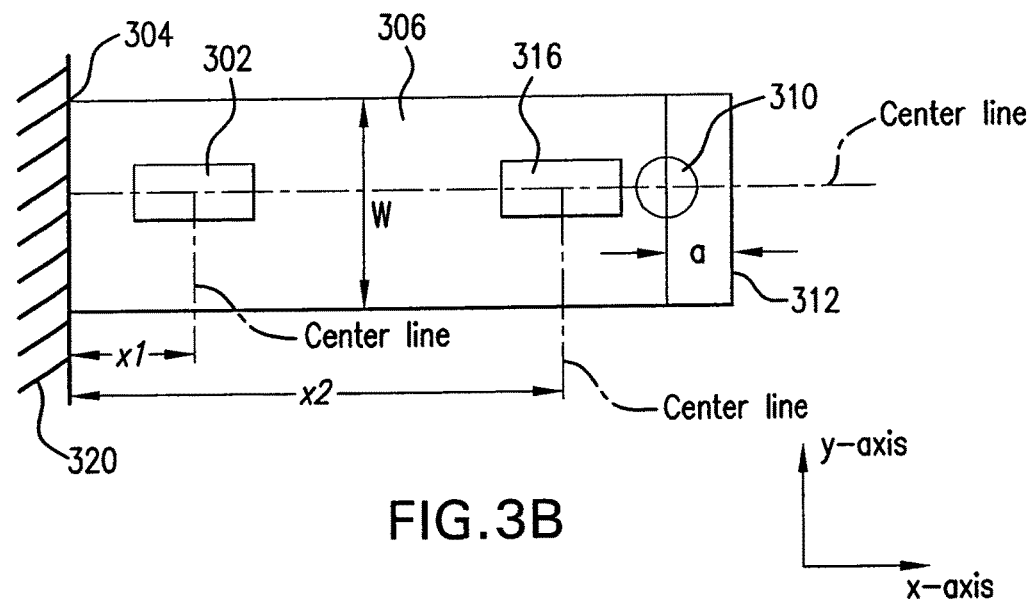
FIG. 3B illustrates a top view of a moment compensated bending beam sensor including two strain gauges in an embodiment.
Figure 3C:
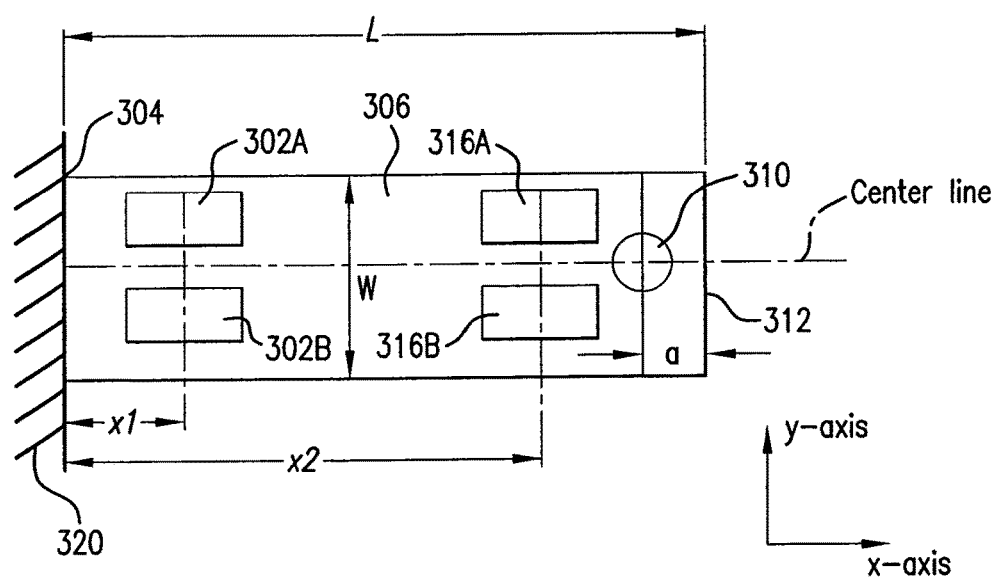
FIG. 3C illustrates a top view of a moment compensated bending beam sensor including two pairs of strain gauges or four strain gauges in an embodiment.

FIG. 3A illustrates a side view of a moment compensated bending beam sensor including at least two strain gauges on one side of a beam for load measurement in an embodiment. The moment compensated bending beam sensor uses the at least two strain gauges differentially to subtract out any applied moments. FIG. 3B illustrates a top view of a moment compensated bending beam sensor including two strain gauges in one embodiment. FIG. 3C illustrates a top view of a moment compensated bending beam sensor including two pairs of strain gauges or four strain gauges in another embodiment.

As shown in FIGS. 3A-C, a first strain gauge 302 or a pair of strain gauges 302A-B is placed at or near a beam base 304 or root of a beam 306 oriented along its axial axis, labeled as X-axis, a second strain gauge 316 or a pair of strain gauges 316A-B is placed near a free end 312 of the beam 306 also oriented along the axis of the beam. The strain gauges 302 and 316, or 302A-B and 316A-B are oriented so they respond to strain along the X-axis. The second strain gauge or pair of strain gauges may be closer to the beam base 304 or root of the beam than a support or connection 310 between the beam 306 and plate 308. More specifically, the center of the second strain gauge 316 may be closer to the base of the beam than the center of the support or connection 310 between the beam 306 and plate 308. Note that the beam bends near the free end 312 of the beam such that the free end 312 is angled from the end of the beam at the beam base 304 under the applied force F.

In certain embodiments, the support or connection 310 may be a viscoelastic polymer, such as a gel. The term "gel" may refer to any suitable, deformable substance that connects the beam and plate. In some embodiments, an adhesive may be used in place of, or in addition to, a gel. In other embodiments, the gel may be omitted. In still further embodiments, a mechanical fastener may affix the beam and plate.

Figure 3D:
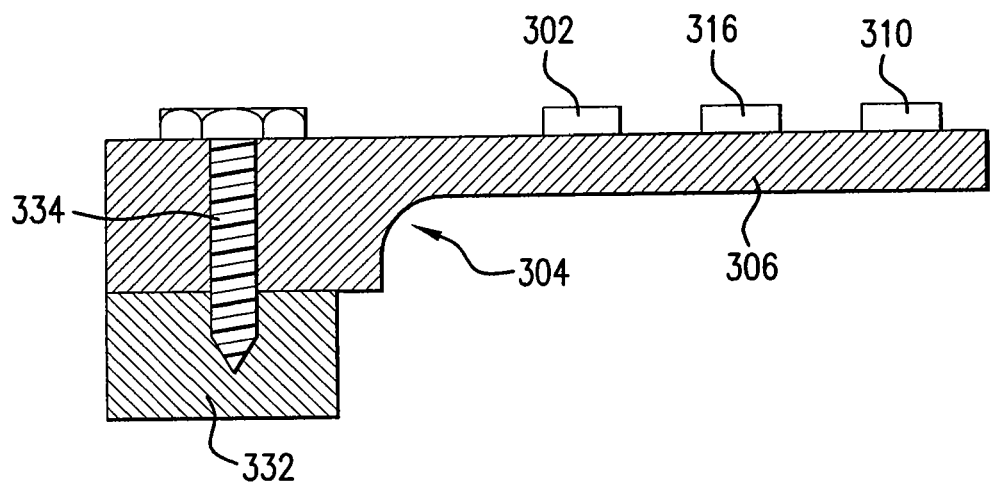
FIG. 3D illustrates a side view of a moment compensated bending beam with a flexible support in one embodiment.
Figure 3E:
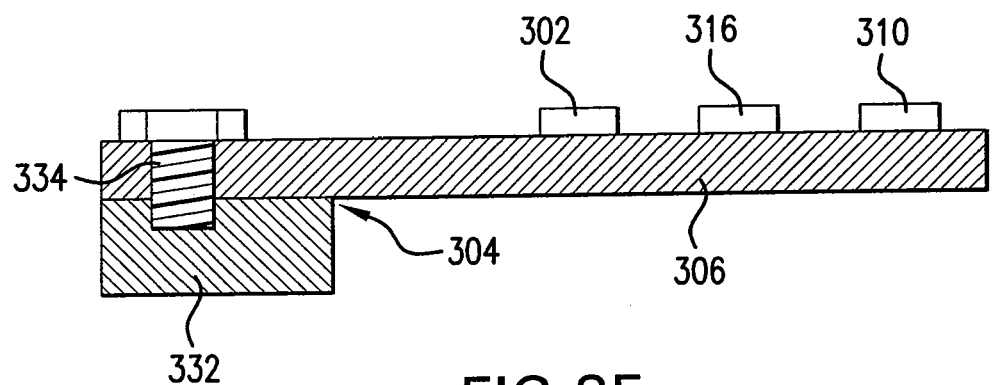
FIG. 3E illustrates a side view of a moment compensated bending beam with a flexible support in another embodiment.

In FIG. 3A, the beam 306 is shown as being attached to a rigid support 320. In an alternative embodiment, the rigid support 320 may be replaced by a flexible support 332, such as shown in FIGS. 3D and 3E. The beam may be clamped or welded to the flexible support 332 by fastener 334. The flexible support 332 may be substantially stiffer than the beam 306.

In another embodiment, as shown in FIG. 3D. the beam end near beam base 304 may formed by thickening the beam. For example, the thickness of the beam may be changed dramatically (1.5× to 5× thickness) to create a stiffness change. As shown in FIG. 3E, the beam may not have any thickening toward the end.

In yet another embodiment, the beam width may be changed to produce a stiffness change. In still yet another embodiment, any combination of the beam thickness variation, beam stiffness variation, beam width change may also create an end substantially stiffer than the beam. In a further embodiment, the beams may have both ends connected to a flexible support or a rigid support. In yet a further embodiment, the two ends of the beam may have a combination of the beam thickness variation, beam stiffness variation, beam width change, which may create two ends substantially stiffer than the beam.

The beam may have a uniform thickness between the two strain gauges 302 and 316. Alternatively, the thickness or width of the beam may change between the two strain gauges. Mathematically, the curvature between the two strain gauges 302 and 316 has a second derivative of zero under an applied load or force. Generally during operation, there are no external loads or forces applied between the two strain gauges.

Figure 4:
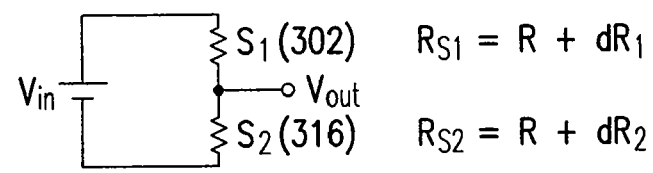
FIG. 4 illustrates a diagram of electrical connection for the two strain gauges for a moment compensated bending beam sensor in an embodiment.

In one embodiment, the two strain gauges 302 and 316 are connected electrically as one arm of Wheatstone bridge (see FIG. 4). A force applied to the free end of the bending beam will induce a moment that changes along the length of the beam. This will induce different magnitude changes in resistance at the two strain gauges and cause the output of the half Wheatstone bridge to change. This output is a differential output from the two strain gauges 302 and 316. In an alternative embodiment, the strain gauges may be connected to separate half bridges. The signals from these separate bridges may be subtracted using an analog or digital circuit. In some instances, it may be necessary to apply separate scaling to each signal before they are subtracted.

The output voltage for the moment compensated bending beam sensor is a differential signal of the output from the two strain gauges 302 (S1) and 316 (S2). At strain gauge 302, $$M_1 = F(L - x_1 - a) \quad \text{Equation (1)}$$

$$\varepsilon_1 = M_1 t / 2EI \quad \text{Equation (2)}$$

$$dR_1 = RG\varepsilon_1 \quad \text{Equation (3)}$$

At strain gauge 316, $$M_2 = F(L - x_2 - a) \quad \text{Equation (4)}$$

$$\varepsilon_2 = M_2 t / 2EI \quad \text{Equation (5)}$$

$$dR_2 = RG\varepsilon_2 \quad \text{Equation (6)}$$

where $M_1$ and $M_2$ are the moments, and $\varepsilon_1$ and $\varepsilon_2$ are the strains, E is the Young's modulus, I is the moment of inertia of the beam, $dR_1$ and $dR_2$ are the resistance changes of the respective strain gauges 302 and 316, R is the resistance of each of the strain gauges 302 and 316, G is the gauge factor of the strain gauges, t is the thickness of the beam, w is beam width, and L is the length of the beam. a is the position of the force, or the distance of the load from the free end 312 of the beam 306. In some embodiments, the resistances of the two strain gauges may not be equal.

Note that both $dR_1$ and $dR_2$ depend upon the beam length L and the position of the force a. However, a differential signal $\Delta$ is independent of the beam length L and the position of the force a. The differential signal is the difference between $dR_1$ and $dR_2$, which is expressed as follows:

$$\Delta = dR_1 - dR_2 = RGtF(X_2 - X_1)/2EI \quad \text{Equation (7)}$$

Figure 5:
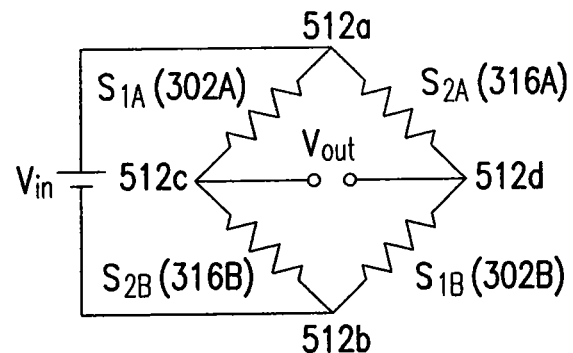
FIG. 5 illustrates a Wheatstone bridge connection for the two pairs of strain gauges for a moment compensated bending beam sensor in an embodiment.

In an alternative embodiment, four strain gauges 302A-B and 316A-B are connected electrically as a full Wheatstone bridge. FIG. 5 is a circuit diagram for electrical connections of Wheatstone bridge for a moment compensated bending beam sensor, including four strain gauges, in accordance with another embodiment. The output voltage $V_{out}$ does not depend on the position of the force or the length of the beam. The Wheatstone bridge is an electrical circuit used to measure an unknown electrical resistance by balancing two legs of a bridge circuit. One leg includes the unknown component and three legs are formed by a resistor having a known electrical resistance. In this configuration, the four strain gauges replace the three known resistors and one unknown component. Instead of balancing the resistors to get a nearly zero output, a voltage output $V_{out}$ is generated with the resistances of the strain gauges 302A (S1A), 302B (S1B), 316A (S2A), and 316B (S2B). A moment applied to the free end 312 of the beam 306 induces resistance change in each strain gauge. The output nodes are 512a, 512b, 512c, and 512d, which are also shown in FIGS. 6B and 6C as electrical contact 512.

Figure 6A:
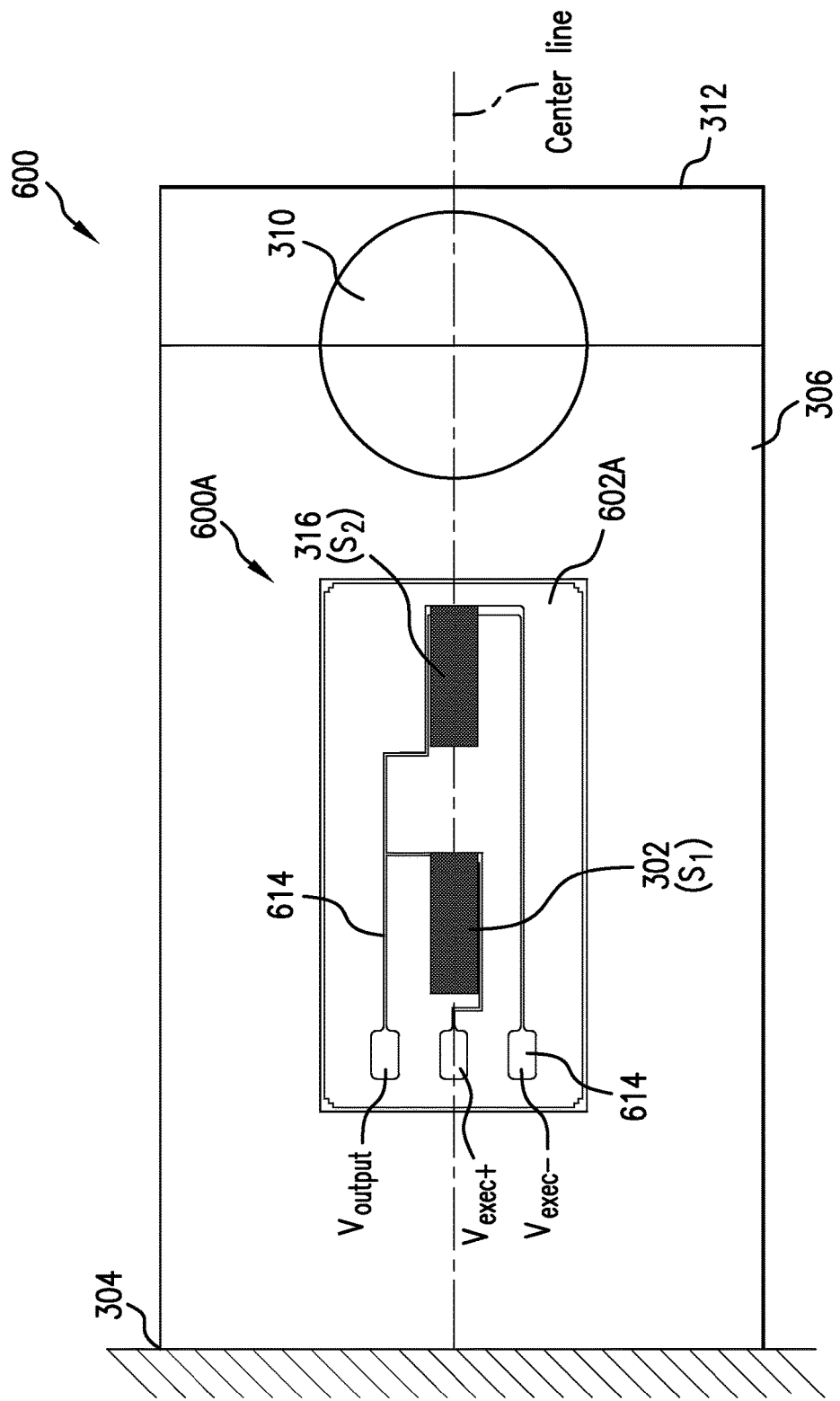
FIG. 6A is a top view of a moment compensated bending beam sensor including two strain gauges on a common carrier aligned with a bending beam in an embodiment.

FIG. 6A is a top view of a moment-compensated bending beam sensor device in accordance with an embodiment. The sensor device 600 includes a bending beam 306 and two strain gauges on a common carrier 602A and aligned with the bending beam 306. The beam sensor 600A is placed on the beam such that strain gauge S1 is near electrical contact 614 (which is closer to the beam base 304) and strain gauge S2 is closer to the free end 312 where the force is applied. It may be useful to have the electrical contact 614 of the sensor 600A positioned away from the loading position to avoid damage to the contacts or unnecessarily extending electrical contacts along the length of the beam, although it should be understood that alternative embodiments may orient the sensor differently. The carrier 602A or sensor 600A is aligned with the central X-axis of the beam. In this embodiment, Vexc+ is connected to beam sensor 302 and Vexc− is connected to beam sensor 316. The output $V_{output}$ is connected between sensors 302 and 316.

Figure 6B:
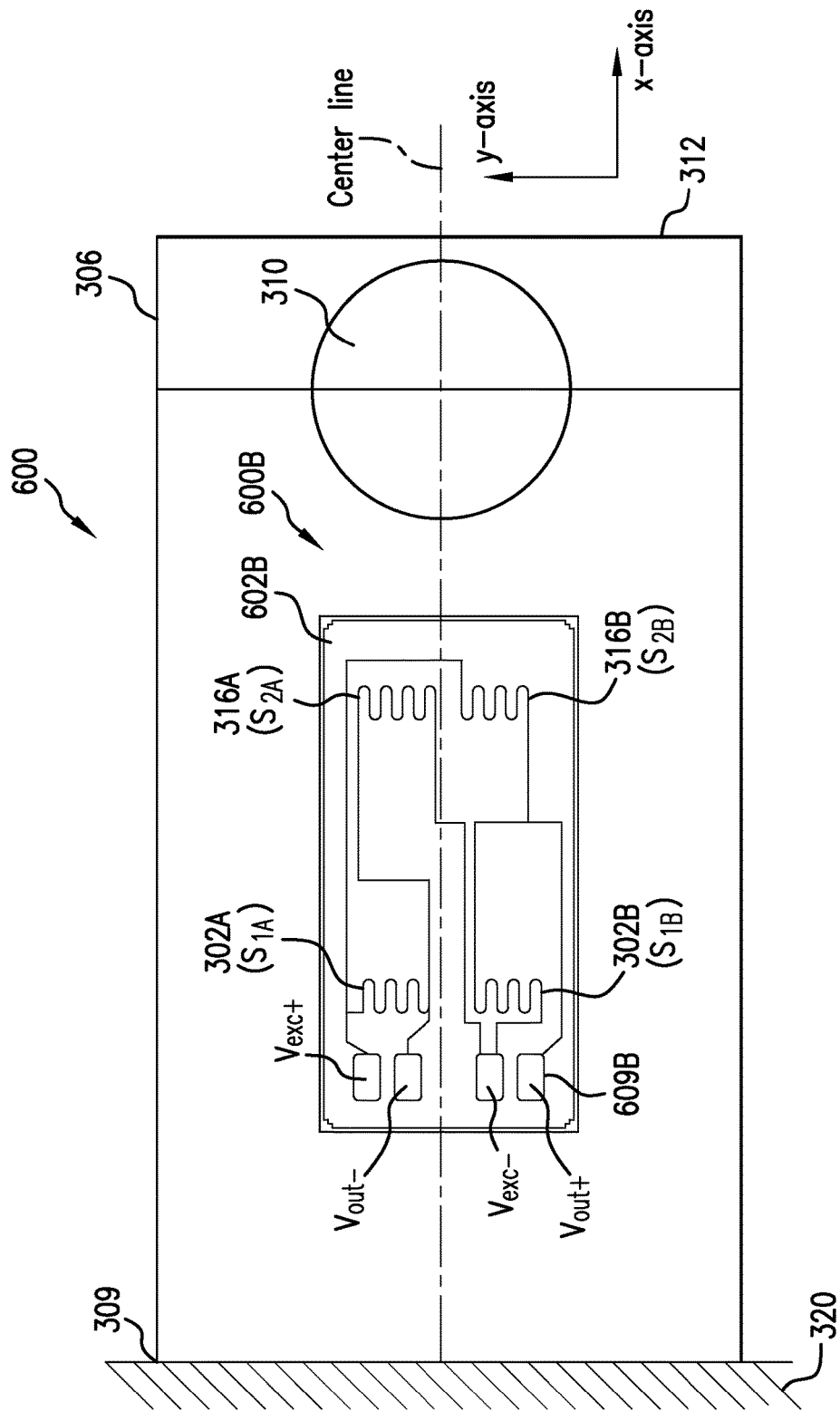
FIG. 6B is a top view of a moment compensated bending beam sensor including four strain gauges on a common carrier aligned with a bending beam in another embodiment.

FIG. 6B is a top view of a moment compensated bending beam sensor including four strain gauges on a common carrier 602B aligned with a bending beam 306 in another embodiment. Again, the sensor 600B is placed on the beam 306 such that the electrical contact 512 is closer to the beam base 304 and further away from the free end 312 of the beam. The electrical contact 512 includes four output nodes from the Wheatstone bridge. The electrical contact 512 may also include a wire bond pad for temperature compensation. Again, the carrier with the strain gauges S1A, S1B, S2A, and S2B is aligned with the central X-axis of the beam.

FIG. 6B also shows a wiring layout of the four strain gauges, connected in a Wheatstone bridge, in a moment-compensated bending beam sensor in one embodiment. In this scheme, electrical contact pads 604B are connected to nodes 512a-d as shown in FIG. 5. In this embodiment, positive input voltage Vexc+ is connected to beam sensors S1A (302A) and S2B (316B) and negative input voltage Vexc− is connected to sensors S1B (302B) and S2B (316B). One side of the differential output, negative output Vout−, is connected between sensors S1A (302A) and S2A (316A) and the second side of the differential output, positive output Vout+, is connected between beam sensors S1B (302B) and S2B (316B).

Aluminum and steel are popular choices for a beam material. They are commonly available in many useful preformed sizes and strain sensors are available with built in compensation for thermal expansion. Other materials are possible, including titanium, plastic, brass and so on.

Additionally, this disclosure provides a method for implementing a plate mounting scheme, where the plate is supported on its four corners by four bending beams. The plate is attached to the beams in any suitable fashion, such as by a viscoelastic polymer. In alternative embodiments, the plate may be attached to the beams with adhesive, through welding, mechanical fixtures and the like.

Each of the four bending beams has a bending beam sensor including strain gauges. The gel 110 may exhibit a viscoelastic response and change shape in response to the applied force with a time constant of seconds. As the gel changes shape, the location of the applied force shifts. Because the strain gauges are moment insensitive, the outputs of the strain gauges are not affected by this viscoelastic response of the polymer.

Figure 7A:
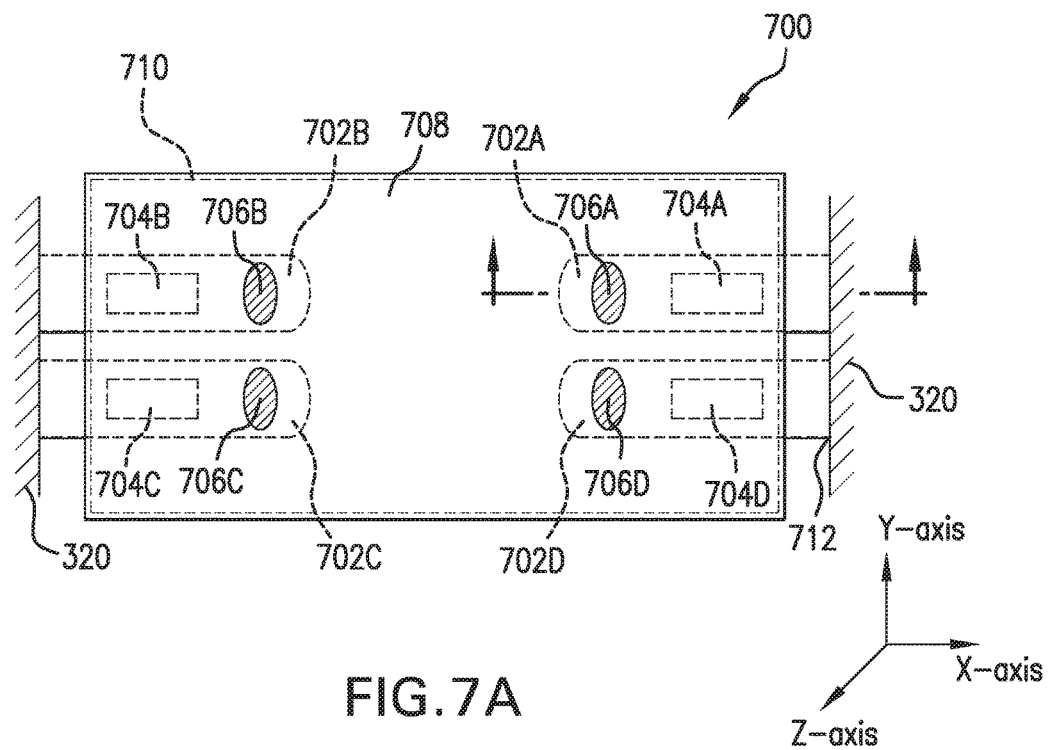
FIG. 7A is a top view of a system diagram for a trackpad (TP) supported with four bending beams and load measurements with four moment compensated bending beam sensors in an embodiment

FIG. 7A is a top view of a system diagram for a trackpad 700. Dashed lines indicate elements that ordinarily are not visible in the view of FIG. 7A, but are shown to illustrate certain principles of the invention. The trackpad 700 includes a platform or plate 708 which may be supported by four bending beams 702A-D and also includes four moment-compensated bending beam sensors 704A-D. The trackpad plate 708 is coupled to the four bending beams near four corners of the plate. The coupling is achieved by bonding the plate to the aforementioned gel 706A-D. The gels may be in any shape including circular and non-circular shapes. For example, FIG. 6A shows a gel having a circular cross-section while FIG. 7A shows a gel having an oval cross-section. Other shapes (either planar or three-dimensional) may be used in varying embodiments. Although the gels are shown in the figures, the gels may be removed in some embodiments. A position sensor 710 may be placed at or near the gel/plate coupling, along a surface of the plate 708. The position sensor 710 is under the trackpad, as shown by dashed lines. Also, the position sensor may include a position sensing layer as large as the platform 708 of the trackpad in a form of grid.

Each moment compensated beam sensor includes at least two strain gauges which are wired together to produce a differential signal in one embodiment. In an alternative embodiment, each moment compensated beam sensor includes four strain gauges which can be wired as a Wheatstone bridge. For the plate, load signals can be obtained from the bending beam sensors in order to determine the force exerted on the trackpad, and load position signals can be obtained from the position sensors.

In a particular embodiment, the bending beam may be approximately 10 mm wide, 10 mm long and 0.5 mm thick, and the trackpad may be approximately 105 mm long and 76 mm wide with thickness ranging from 0.8 mm to 2.3 mm.

It will be appreciated by those skilled in the art that the dimension of the beam may vary for various desired loads and electrical outputs as well as the dimension and shape of the platform.

In certain embodiments, a position-sensing layer may underlie the plate. The position-sensing layer may be, for example, a capacitive sensing layer similar to that employed by many touch screens. The capacitive sensing layer may include electrodes arranged in rows and columns and operative to sense the particular position of a touch. In some embodiments, the position-sensing layer may sense multiple simultaneous touches in a fashion similar to that of a touch screen incorporated into a smart phone, tablet computing device, media player, and like products. As the operation of the touch-sensitive layer is known in the art, it will not be discussed further herein.

It should be appreciated, however, that the position sensing and force sensing of the trackpad may be combined. Accordingly, the various discussions herein regarding force sensing may be applied to a capacitive sensing layer and/or a capacitive sensing display, as well as any other computing element or enclosure that may be touched, pressed or otherwise interacted with. Embodiments described herein may be configured such that forces applied to a display or other computing element may be sensed. The trackpad plate may be replaced by a cover glass or surface of a mobile device, or the like, and forces on such a surface sensed.

In a particular embodiment, the beam has a uniform thickness to reduce the overall dimensions of the trackpad. For certain applications, such as in a tablet computing device, media player, portable computer, smart phone, and the like, a connection between the plate and the beams through a viscoelastic polymer, such as a gel, would be thin.

Figure 7B:
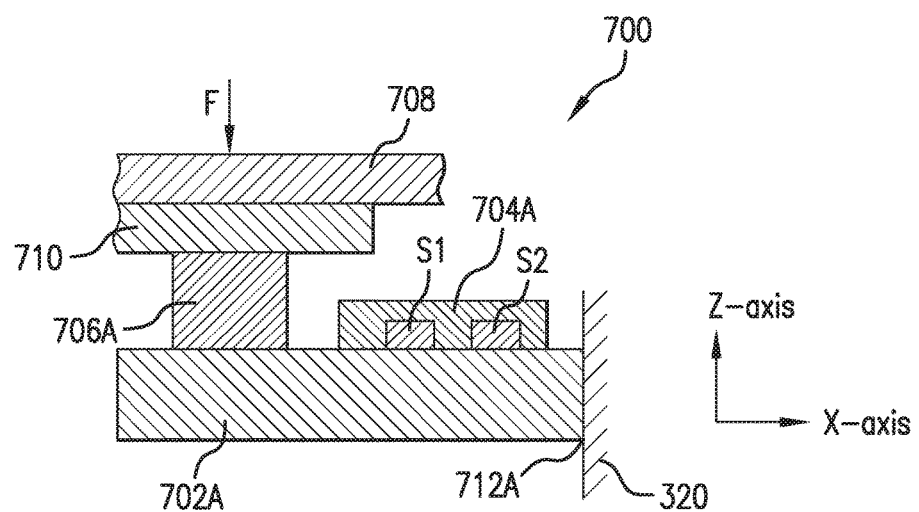
FIG. 7B is a cross-sectional view through bending beam 702A of FIG. 7A.

FIG. 7B is a cross-sectional view through bending beam 702A of FIG. 7A. In this figure, a trackpad plate 708 has position sensor 710 attached. The position sensor 710 is attached to the beam 702A through gel 706A. Note that each of moment-compensated bending beam sensors 704A, 704B, 704C, and 704D includes at least two strain gauges S1 and S2 or two pairs of strain gauges, i.e. four strain gauges.

Figure 7C:
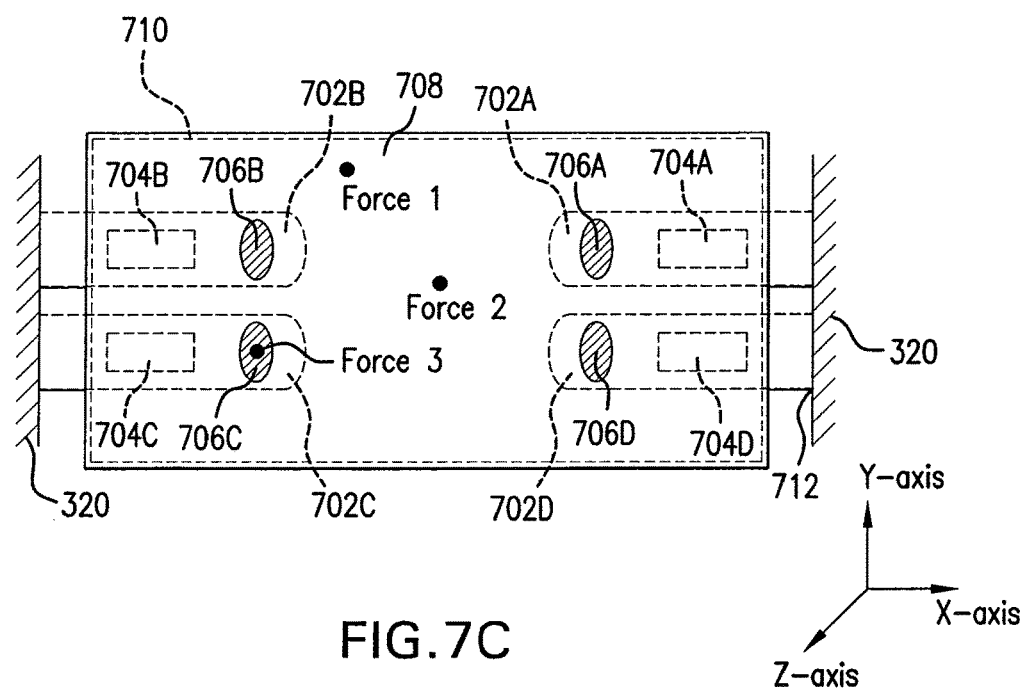
FIG. 7C illustrates a top view of a platform with four bending beams under forces at various force locations in an embodiment.

FIG. 7C illustrates three force locations on platform 708. Force 1 is closer to beam 702B than the other three bending beams and more force will be carried by bending beam 702B than the other beams. To accurately determine the magnitude of Force 1, the forces detected by each of the individual force sensors 704A, 704B, 704C and 704D can be summed. Alternatively, the output of the position sensor 710 can be used with the output from one or more moment compensated bending beam sensors to correlate a position of a touch or other input with a load magnitude. These methods of determining the force magnitude can be used whether the load is applied near the center of the trackpad for Force 2 or at any position on the surface of the platform 708 such as where Force 1 and Force 3 are located.

In some cases, it is desired to approximately determine the force location without using the position sensor or position-sensing layer 710. For each moment compensated beam sensor, the force detected by the beam sensor is multiplied by the position along the central axis of the beam that the force is applied to the individual beam forming a force distance product. The force distance products of all four beams are summed and divided by the total force. The resulting position approximates the position of the force relative to the center of the trackpad. Essentially, the use of three beam sensors permits triangulation of the location of a force by comparing the relative magnitudes of the forces sensed by each beam sensor, although four bending beams are shown in FIG. 7C. Accordingly, each of the beam sensors may be connected to a processor or other computing element that may use the output of the beam sensors to triangulate a location at which a force is applied. This location data may be compared to, or correlated against, load data obtained from the position sensor such that a particular force may be correlated with a particular touch input.

Further, in the case of multi-touch gestures, the location and magnitude of multiple forces may be determined from the outputs of the position sensor and the bending beam sensors, each load correlated with a different touch on the trackpad or other input mechanism. For example, when using two or more fingers to touch a track pad simultaneously, it is required to determine the location and magnitude of multiple forces.

Figure 8A:
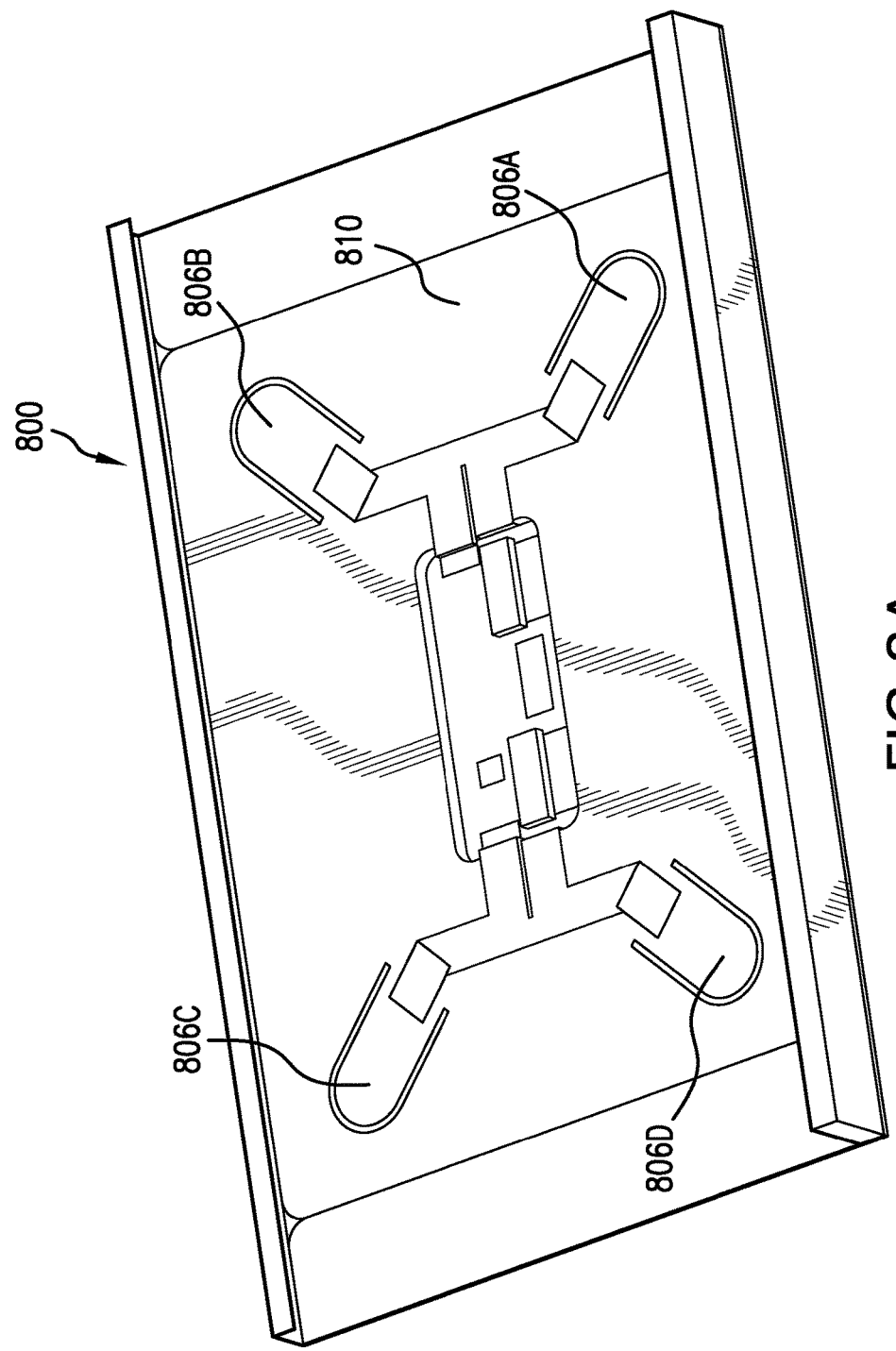
FIG. 8A is a perspective view of the bottom of a trackpad with four bending beams at the corners in another embodiment.

FIG. 8A is a perspective view of the bottom of a trackpad with four bending beams at the corners in another embodiment. Note that the bending beams 806A-D are entirely within the footprint of the trackpad plate 810. In contrast, the bending beams may extend beyond the edges of the trackpad plate, as shown in FIG. 7A.

Figure 8B:
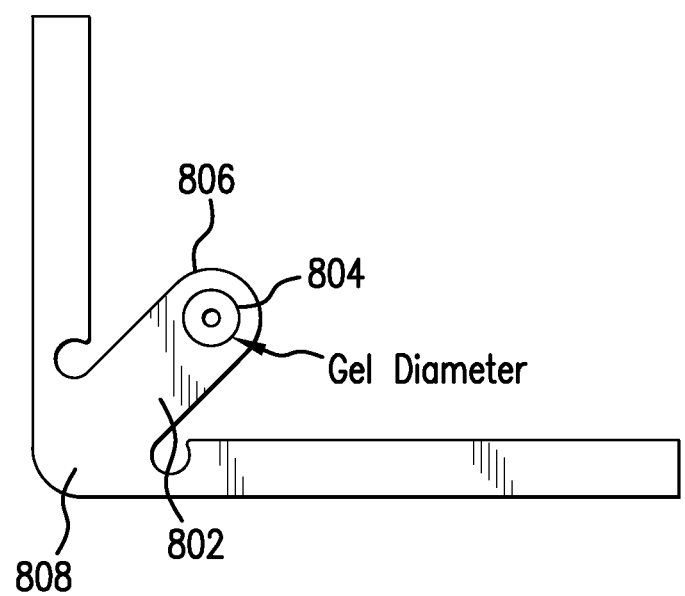
FIG. 8B is an enlarged view of one of the four beams at a corner of FIG. 8A in an embodiment.

FIG. 8B is an enlarged view of one of the four bending beams at a corner in another embodiment. Note that the gel 804 has a circular cross-section and covers, or nearly covers, a free end 806 of the bending beam 802. The opposite end of the beam is attached to a base 808, such as a sidewall of a computing device housing, or a support extending from, or part of, a computing device housing. It should be appreciated that the size, shape and configuration of any portion of the trackpad, including the gel, beams and bases, may vary from embodiment to embodiment. Accordingly, the configurations shown in FIGS. 8A-B are illustrative of two implementations and are not intended to be limiting.

Figure 9:
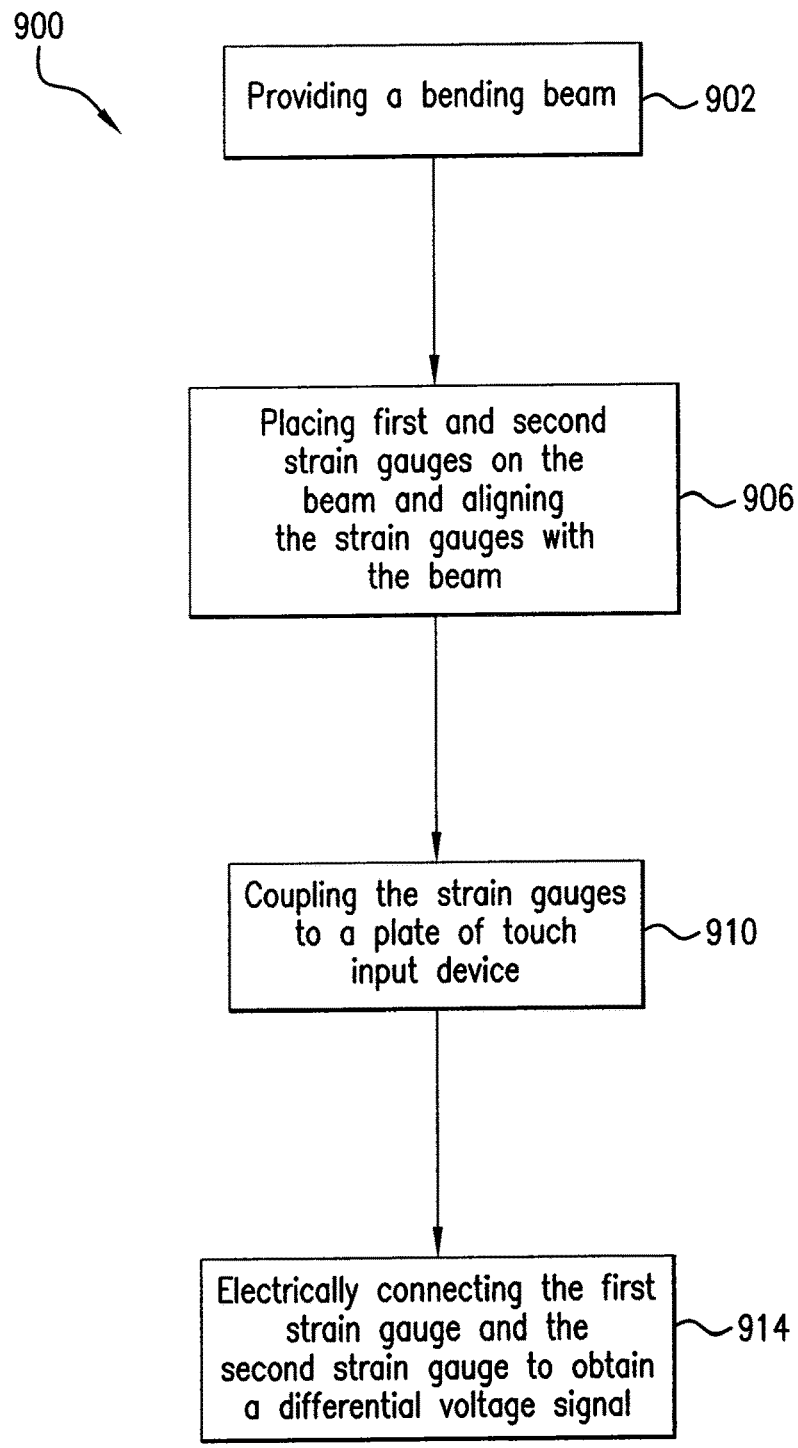
FIG. 9 is a flow chart illustrating the steps for fabricating a moment compensated bending beam sensor coupled to a touch input device in an embodiment.

FIG. 9 is a flow chart illustrating the steps for fabricating a moment compensated bending beam sensor coupled to a touch input device in an embodiment. Method 900 starts with providing a bending beam at operation 902. Method 900 continues with placing a first strain gauge and a second strain gauge on a surface of the beam near a first end of the beam aligning the first strain gauge and the second strain gauge with the beam along an axis at operation 906. The first end is attached to a base. Method 900 also includes coupling the first strain gauge and the second strain gauge to a plate of the touch input device at operation 910. Method 900 further includes electrically connecting the first strain gauge and the second strain gauge such that a differential voltage signal is obtained from the first strain gauge and the second strain gauge when a load is applied on the plate of the touch input device at operation 914.

Figure 10:
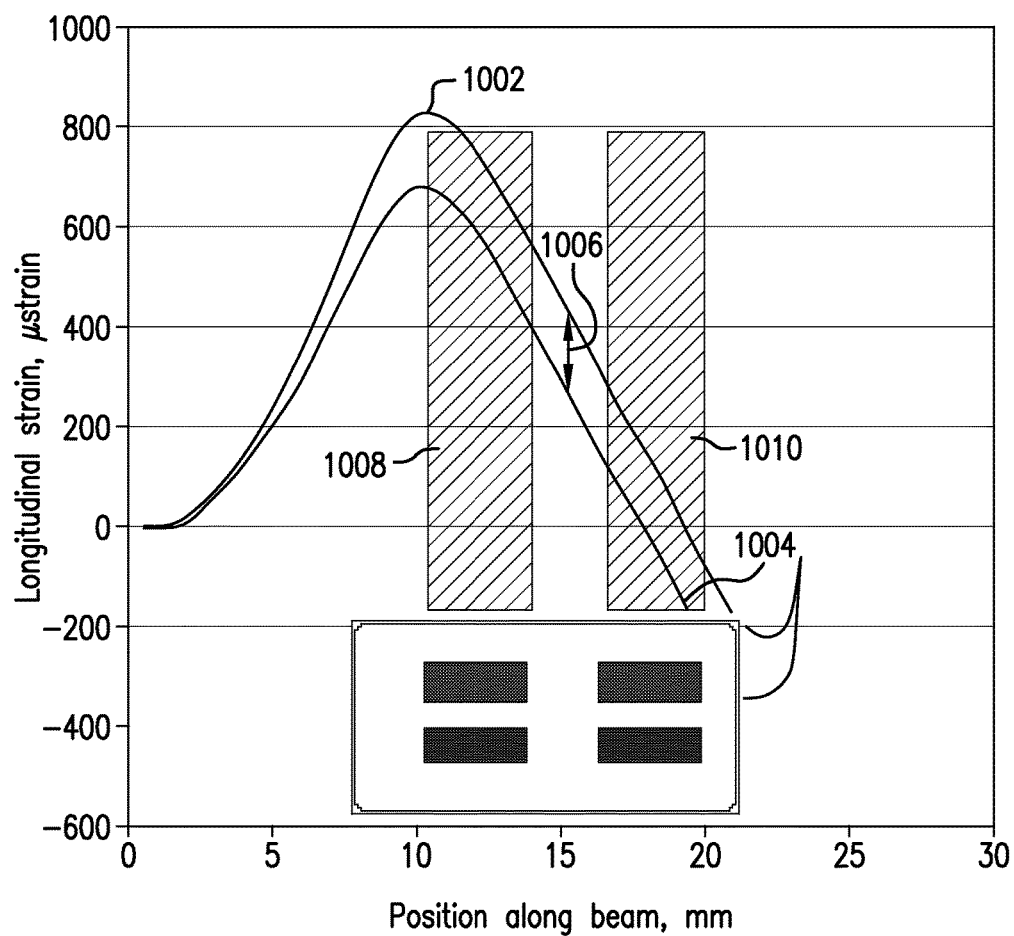
FIG. 10 is exemplary strain profiles with a moment compensated bending beam sensor including four strain gauges aligned with a beam.

FIG. 10 illustrates exemplary strain profiles with a moment compensated bending beam sensor including two strain gauges aligned with a beam. The strain profiles are measured along the central axis of a single beam with the design shown in FIG. 3E when a trackpad is supported by four beams as shown in FIG. 7. The zero position is set at the left hand side of the beam that lies over the flexible support 332. The peak in the strain profile occurs at the edge of the support shelf. The gel is located from position 21 mm to position 27 mm. The bending beam extends from the flexible support 332 to the edge of the gel and is 17 mm long. When a load is applied at the center of the trackpad, similar to Force 2 in FIG. 7C, strain profile 1002 is obtained. In contrast, strain profile 1004 occurs if the load is applied directly over the gel, similar to Force 3 in FIG. 7C. The central load produces 25% more strain near the beam base or root 304 of the beam. A standard bending beam strain sensor located near the root would not give an accurate reading of the force carried by the beam. The differential sensor or moment compensated sensor described in this disclosure gives a reading that is independent of the force location. The strain gauge 302 provides a signal that is proportional to the average strain over the left hand grey band 1008. The strain gauge 316 provides a signal that is proportional to the average strain in the right hand grey band 1010. Because the bending beam sensor including the two strain gauges 302 and 316 subtracts these two signals, the output is only a function of the slope of the two curves. Note that a load curve over the gel 1004 has the same slope as the load curve over the center of the trackpad 1002 even though it is shifted down by an amount 1006. Thus, the moment-compensated strain sensor provides an output which is nearly independent of the location of the applied force. The non-uniformity is approximately 1-2%.

Figure 11:
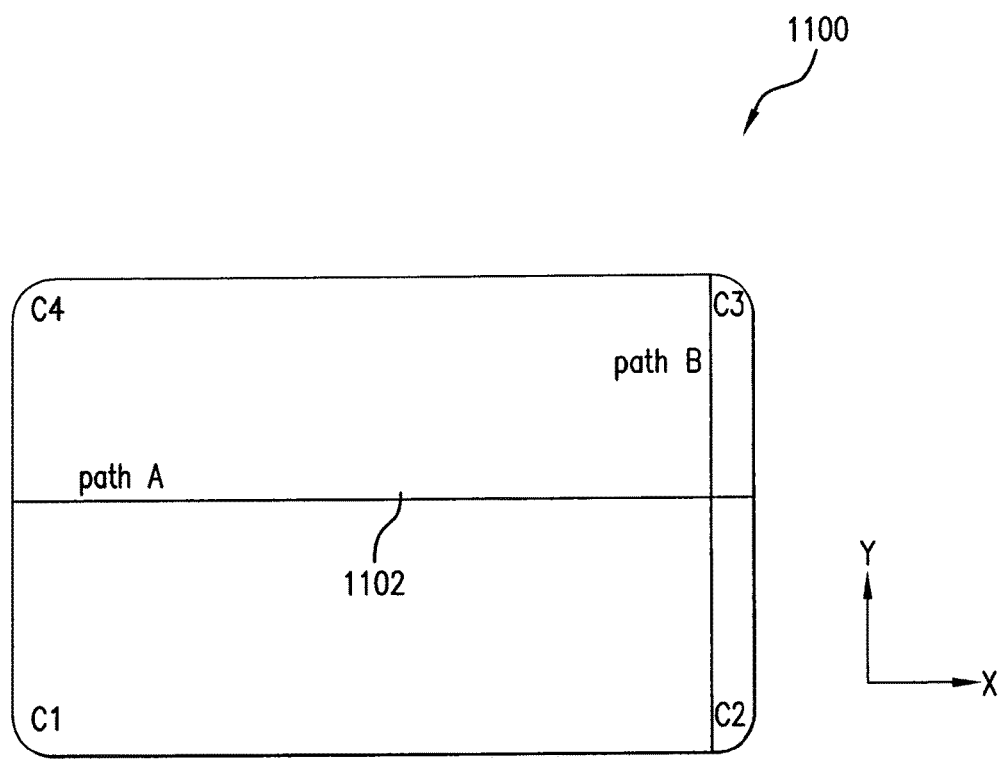
FIG. 11 is an exemplary trackpad in an embodiment.

FIG. 11 is an exemplary trackpad in accordance with a sample embodiment. The trackpad 1100 includes four corners C1, C2, C3, and C4. The trackpad 1100 has a center 1102, a path A along an X-axis through the center and a path B along a Y-axis at a distance from an edge of the trackpad. The trackpad 1100 also has a substantially rectangular shape with round corners. It will be appreciated by those skilled in the art that the shape and dimension may vary.

A moment compensated bending beam sensor may be used for both relatively thin platforms, such as those approximately 0.8 to 1.0 millimeters thick or less, and relatively thick platforms. "Relatively thick," as used here, refers to platforms having a thickness approximately equal to, or greater than, 2.3 millimeters Some examples are shown below.

Figure 12A:
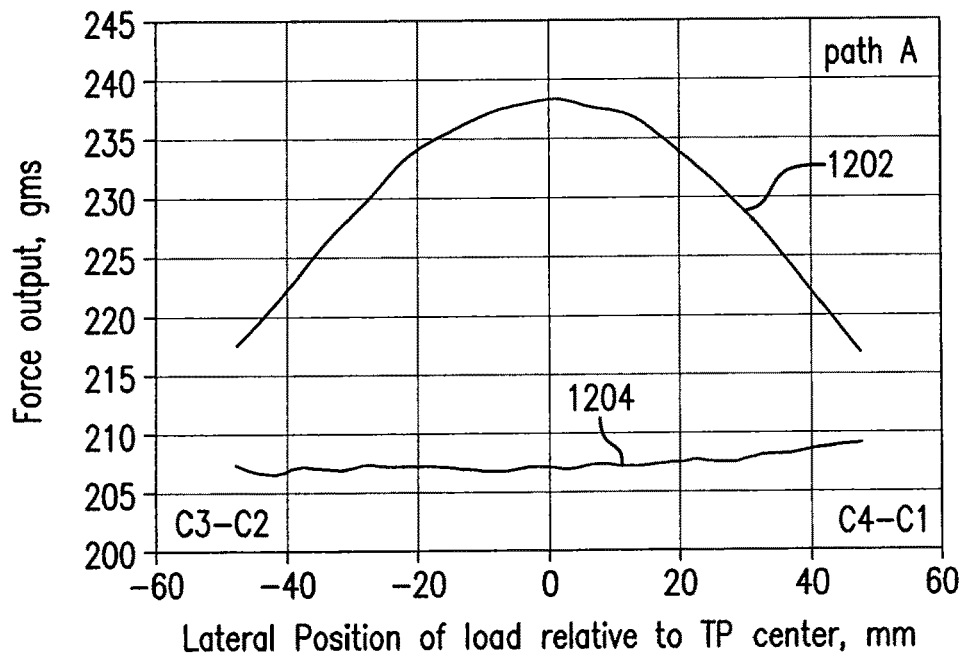
FIG. 12A illustrates one sample force output along path A of FIG. 11 from a moment compensated bending beam sensor and a standard bending beam strain sensor or a non-moment compensated bending beam sensor for a 0.8 mm thick platform.

FIG. 12A illustrates force output formed by the sum of forces measured by each of the individual sensors along path A of FIG. 11 from a moment compensated bending beam sensor for a 0.8 mm thick platform when a 210 gram force is applied on the trackpad. As shown, the moment compensated bending beam sensor exhibits less than 2% non-uniformity, illustrated by curve 1204. In contrast, the standard bending beam strain sensor exhibits force output of curve 1202 and a non-uniformity of about 13.5%, as shown by curve 1202. It should be appreciated that the output shown in FIG. 12A is dependent on a variety of factors, physical constraints, and the like, and accordingly is intended to be illustrative. Alternative embodiments may have different force outputs in response to different forces, and thus the graphs shown should not be considered limiting.

Figure 12B:
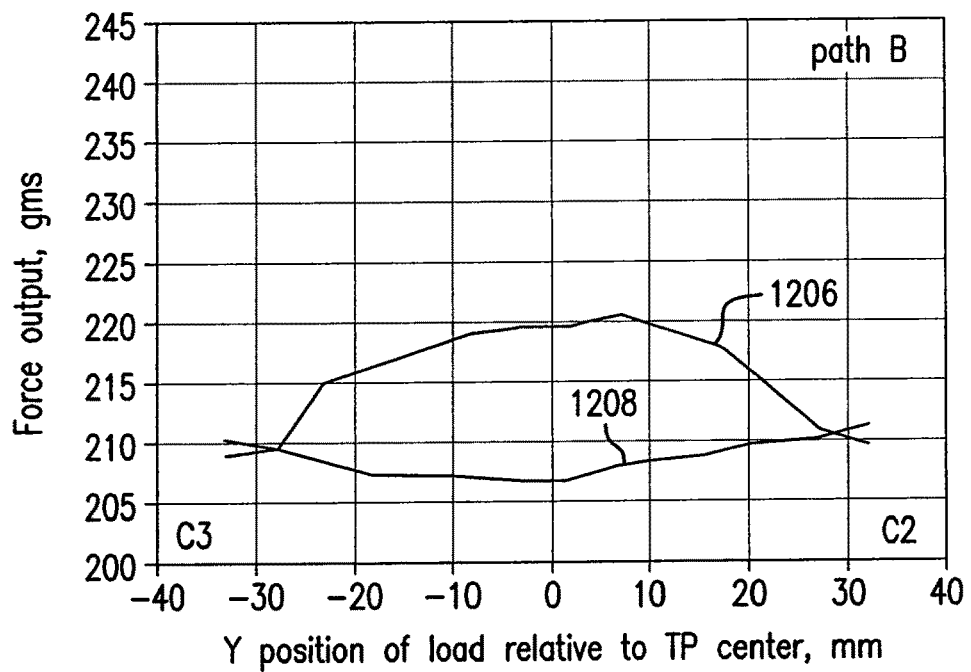
FIG. 12B illustrates one sample force output along path B of FIG. 11 from a moment compensated bending beam sensor and a standard bending beam strain sensor or a non-moment compensated bending beam sensor for a 0.8 mm thick platform.

FIG. 12B illustrates a force output along path B of FIG. 11 from a moment compensated bending beam sensor for a 0.8 mm thick platform when a 210 gram force is applied on the trackpad. As shown, the moment compensated bending beam sensor exhibits less than 2% non-uniformity, as shown by curve 1208. In contrast, the standard bending beam strain sensor exhibits a load variation from about 209 grams to about 221 grams which yields a non-uniformity of about 13.5%, as shown by curve 1206. It should be appreciated that the output shown in FIG. 12A is dependent on a variety of factors, physical constraints, and the like, and accordingly is intended to be illustrative. Alternative embodiments may have different force outputs in response to different forces.

Figure 13A:
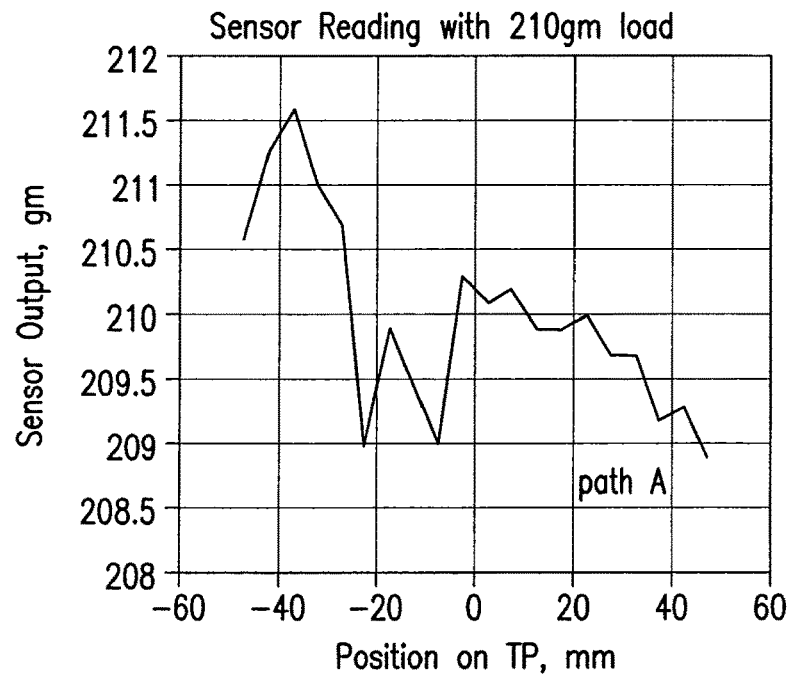
FIG. 13A illustrates one sample force output along path A of FIG. 11 from a moment compensated bending beam sensor for a 2.3 mm thick platform.
Figure 13B:
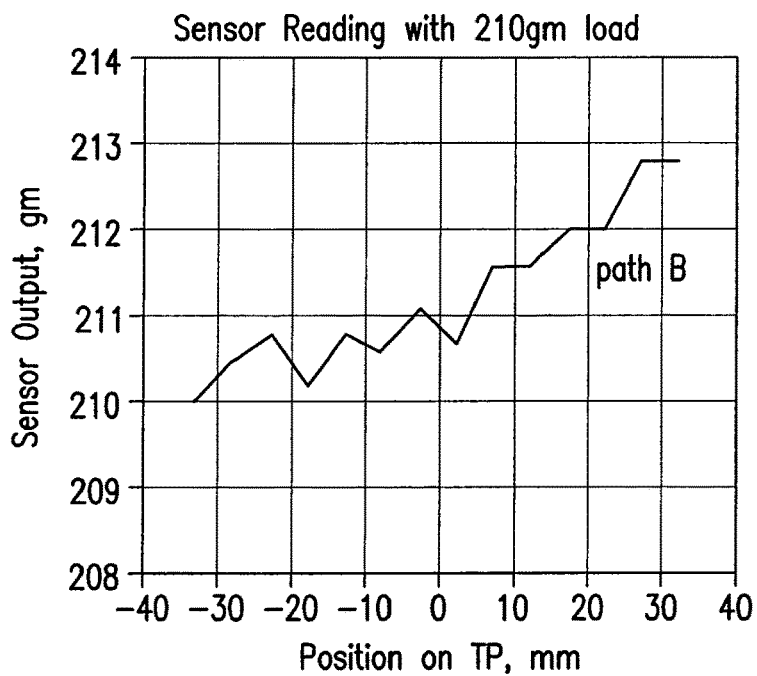
FIG. 13B illustrates one sample force output along path B of FIG. 11 from a moment compensated bending beam sensor for a 2.3 mm thick platform.

FIG. 13A illustrates a force output along path A of FIG. 11 from a moment compensated bending beam sensor for a 2.3 mm thick platform when a 210 gram force is applied on the trackpad. Note that the sensor output varies from about 209 grams to 211.5 grams along path A. The load variation is about 2.5 grams along path A, which suggests a uniformity of load of about 99% along path A. FIG. 13B illustrates force output along path B of FIG. 11 from a moment compensated bending beam sensor for a 2.3 mm thick platform. Again, a 210 gram load is applied on the trackpad. The measured sensor load varies from 210 grams to about 213 grams along path B, which yields a load uniformity of about 98.6% along path B.

Figure 14A:
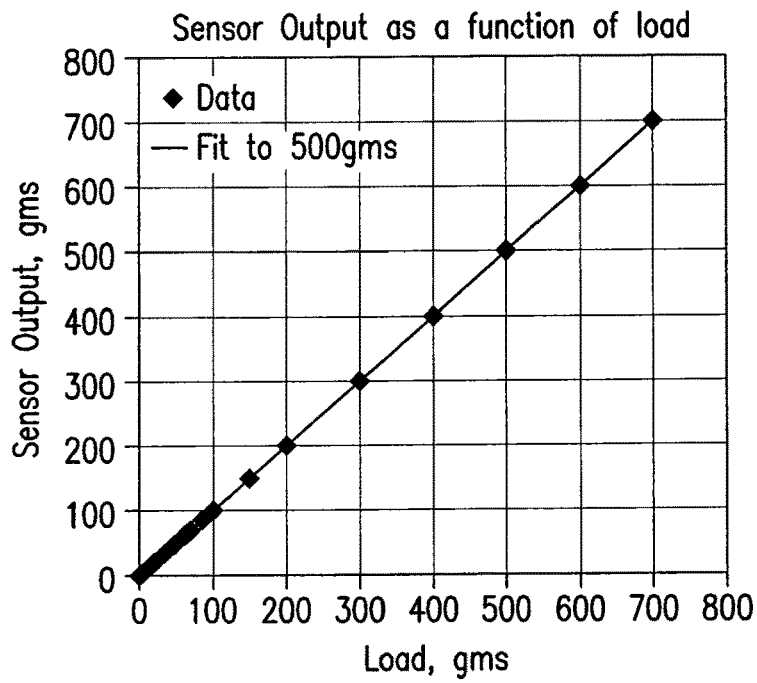
FIG. 14A illustrates a sample linearity of a moment compensated bending beam sensor output as a function of load for a 2.3 mm thick platform.
Figure 14B:
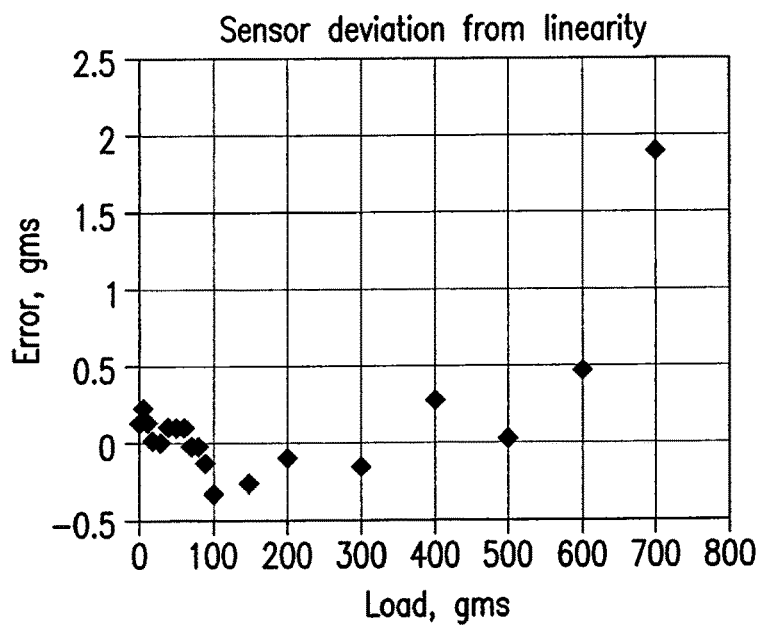
FIG. 14B illustrates a sample moment compensated bending beam sensor deviation from linearity for a 2.3 mm thick platform.

FIG. 14A illustrates the linearity of a moment compensated bending beam sensor output as a function of load for a 2.3 mm thick platform. Note that the moment compensated bending beam sensor is very linear in its load response. The load ranges from 0 to 700 grams. FIG. 14B illustrates a moment compensated bending beam sensor deviation from linearity for a 2.3 mm thick platform. It shows that the error in load is less than about 0.3 grams for load up to 500 grams. It should be appreciated that the outputs shown in FIGS. 13A, 14B and 14 are dependent on a variety of factors, physical constraints, and the like, and accordingly are intended to be illustrative. Alternative embodiments may have different force outputs in response to different forces, and thus the graphs shown should not be considered limiting.

Figure 15:
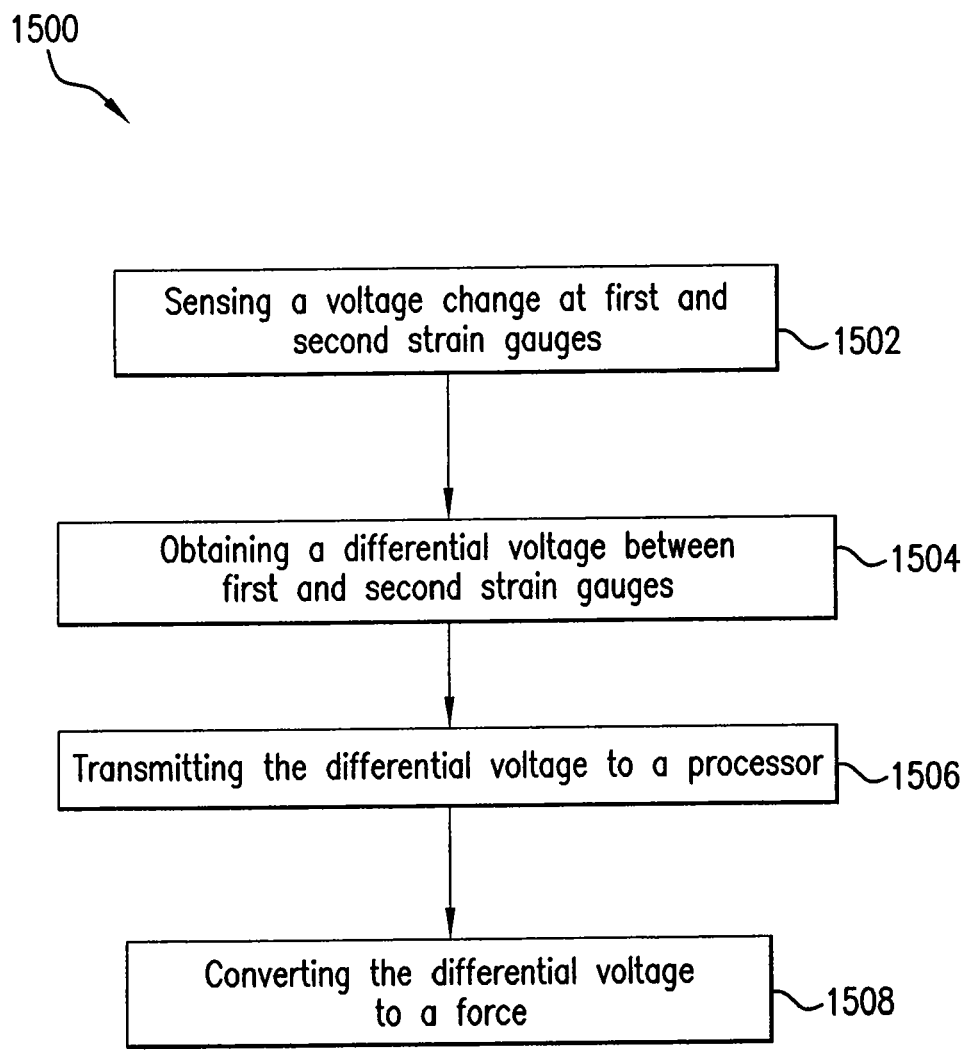
FIG. 15 is a flow chart illustrating the steps for determining a force and a location of the force for a trackpad with a moment compensated bending beam sensor in an embodiment.

FIG. 15 is a flow chart illustrating the steps for determining a force and a location of the force for a trackpad with a moment compensated bending beam sensor in an embodiment. Method 1500 starts with sensing, at a first and a second strain gauges, the voltage change on the plate at operation 1502. The first and the second strain gauges are positioned on a common side of a single beam coupled to the plate. Then, method 1500 is followed by operation 1504 for obtaining a differential voltage between the first strain gauge and the second strain gauge. Method 1500 continues to operation 1506 for transmitting the differential voltage to a processor and operation 1508 for converting the differential voltage to a force on the plate.

Figure 16:
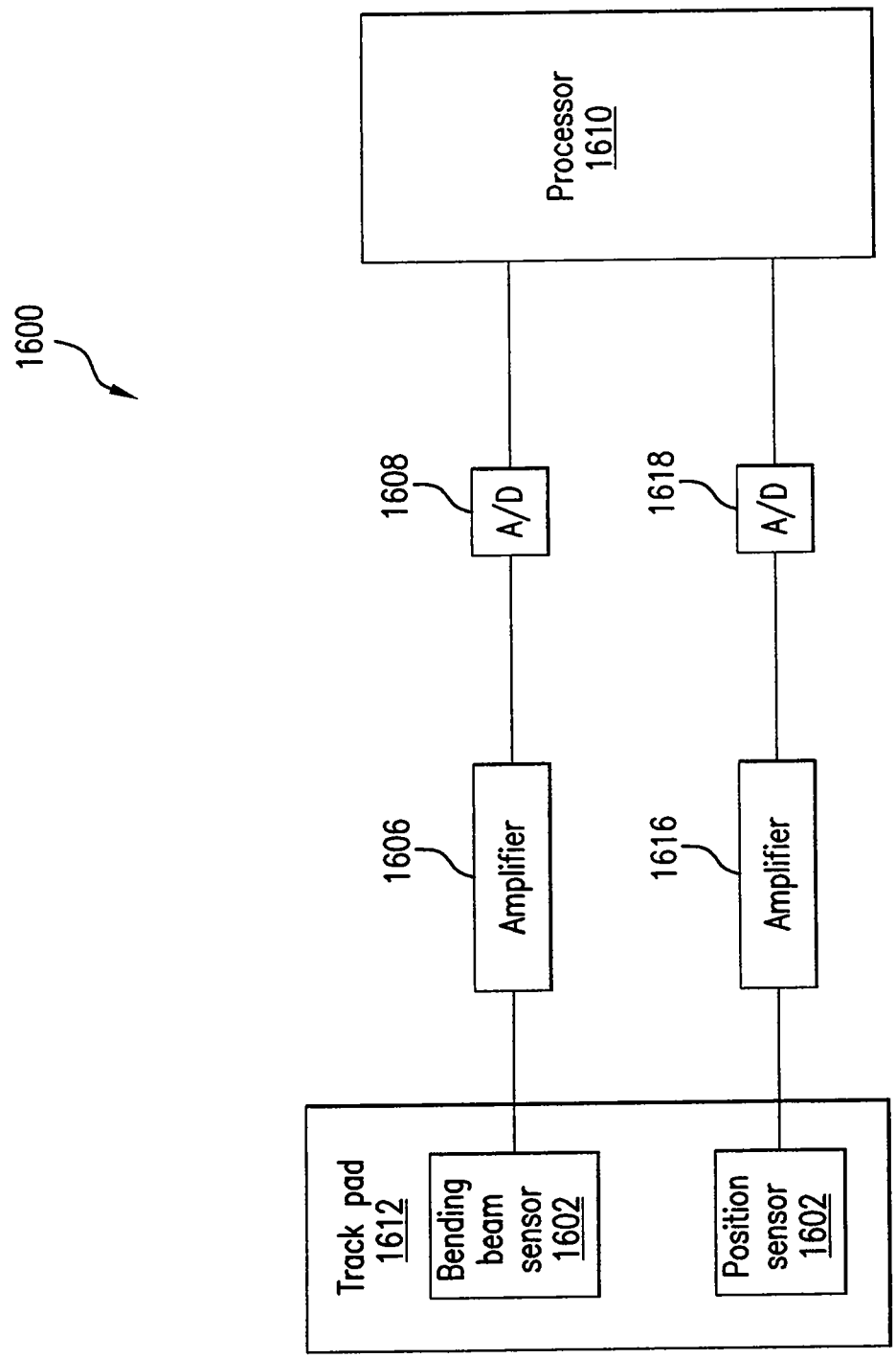
FIG. 16 is a simplified system diagram for a trackpad in an embodiment.

FIG. 16 is a simplified system diagram for processing the signals from trackpad in an embodiment. System 1600 includes a trackpad 1612 that includes a platform supported by at least one bending beam or multiple bending beams. Each bending beam includes one moment compensated bending beam sensor 1602. The moment compensated bending beam sensor 1602 is coupled to an amplifier 1606 that is coupled to an analog-to-digital (A/D) converter 1608. Each bending beam also includes one position sensor 1604. The position sensor 1604 is coupled to an amplifier 1616 that are coupled to an analog-to-digital (A/D) converter 1618. A processor 1610 is coupled to the A/Ds 1608 and 1618 to process the force signal and position signal to determine the magnitude and position of a force or multiple forces.

The moment compensated bending beam sensors may include one or more strain gauges to measure force. The position sensors 1604 may include capacitive measuring electrodes. The trackpad is a touch input device which is different from a simple binary mechanical switch, which may be in an "on" or "off" state. The touch input device can measure a variable force or a constant force and output more than "over threshold" or "under threshold". The platform may be optically transparent or opaque.

It should be appreciated that the present embodiment employs a double bending beam strain gauge but does so on a non-standard beam. That is, the beam itself is not a double-bending (or contraflexured) beam. In contrast to double bending beams, neither the angle of the beam 306 at its root or the angle of the beam at the free end are constrained to be fixed or parallel. The beam largely deforms along a single curve when a force is applied instead of bending into an S-shape like a double-bending beam. Further, unlike many contraflexured beams, the present beams may have a relatively uniform thickness. Many contraflexured beams are thinner in cross-section at one point along their length to induce the S-shape curvature when the beam is loaded. In an alternative embodiment, the beam thickness may vary. For example, the beam thickness in the strain gauge area or an active area may vary from a non-active area without the strain gauge. Still further, some embodiments discussed herein generally place all strain gauges on a single side of each beam rather than distributing them across opposing sides as may be done with both contraflexure beams and single-bending beams. In this invention, the strain sensors have been described as resistive gauges in which the resistance is proportional to the beam strain. It will be recognized by those skilled in the art that semiconductor strain gauges, micromachined strain gauges or optical strain gauges could also be employed in a similar fashion to provide a signal that is independent of the load position.

Moreover, the signals from the differential strain gauges 302 and 316 may be combined in a Wheatstone bridge; however, in some instances, it may be desirable to convert the electrical signals from the differential strain gauges separately into digital form. These digital signals could then be scaled and subtracted to provide a moment compensated signal. Independent scaling of the two gauge signals may be especially desired when the thickness of the beam varies between the location of strain gauge 302 and strain gauge 316.

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A trackpad for a laptop computer, comprising:
   a plate defining an input surface and configured to receive a force input;
   a moment compensated sensor device coupled to and positioned below the plate and comprising:
      a bending beam defining a cantilevered structure having a first end and a second free end extending from a rigid support; and
      a bending beam sensor attached to the bending beam and comprising a first strain gauge and a second strain gauge that are aligned along a longitudinal axis of the bending beam and positioned between the first end and the second free end;
   a position sensor attached to the plate and configured to detect a location of the force input on the input surface; and
   a deformable substance elastically coupling the plate to the bending beam.

2. The trackpad of claim 1, wherein the first strain gauge and the second strain gauge are electrically connected to generate a differential output when the force is applied on the plate.

3. The trackpad of claim 1, wherein the deformable substance is a viscoelastic polymer positioned near the second free end of the bending beam, the bending beam sensor being at a further distance from the second free end than the viscoelastic polymer.

4. The trackpad of claim 1, wherein the bending beam sensor comprises a carrier, the first strain gauge and the second strain gauge being placed on the carrier.

5. The trackpad of claim 1, wherein the bending beam is configured to bend near the second free end of the bending beam such that the second free end is angled from the first end of the beam.

6. The trackpad of claim 1, wherein the rigid support comprises at least one of: a sidewall of a computing device housing, a support extending from a computing device housing, or a part of a computing device housing.

7. The trackpad of claim 1, wherein:
   the bending beam is a first bending beam;
   the bending beam sensor is a first bending beam sensor; and
   the moment compensated sensor device further comprises:
      a second bending beam defining a cantilevered structure having a first free end and a second free end extending from the rigid support; and
      a second bending beam sensor attached to the second bending beam, wherein the second bending beam sensor comprises a third strain gauge and a fourth strain gauge, the third and fourth strain gauges being aligned along a longitudinal axis of the second bending beam.

8. The trackpad touch input of claim 7, wherein the moment compensated sensor device further comprises:
   a third bending beam defining a cantilevered structure having a first free end and a second free end extending from the rigid support;

a fourth bending beam defining a cantilevered structure having a first free end and a second free end extending from the rigid support;
a third bending beam sensor attached to the third bending beam, wherein the third bending beam sensor comprises a fifth strain gauge and a sixth strain gauge, the fifth and sixth strain gauges being aligned along a longitudinal axis of the third bending beam; and
a fourth bending beam sensor attached to the fourth bending beam, wherein the fourth bending beam sensor comprises a seventh strain gauge and an eighth strain gauge, the seventh and eighth strain gauges being aligned along a longitudinal axis of the fourth bending beam.

9. The trackpad touch input of claim 8, wherein the plate is a trackpad plate for an electronic device.

10. The trackpad touch input of claim 8, wherein:
the plate defines four corners; and
each of the four bending beams is coupled to the plate near a respective corner of the plate.

11. The trackpad of claim 8, wherein each bending beam is configured to deform in response to a force being applied to the plate.

12. A trackpad for a laptop computer, comprising:
a plate configured to receive a force on a top surface of the plate;
a position sensor attached to the plate;
four bending beams coupled to the plate and the position sensor, each bending beam positioned below the plate and having a first end and a second free end extending from a rigid support;
a bending beam sensor attached to each bending beam and comprising a first pair of strain gauges and a second pair of strain gauges that are aligned along a longitudinal axis of the bending beam and positioned between the first end and the second free end; and
a deformable substance elastically coupling the plate to at least one of the four bending beams.

13. The trackpad of claim 12, wherein the first pair of strain gauges and the second pair of strain gauges are electrically wired as a Wheatstone bridge such that each bending beam sensor outputs a signal when the force is received.

14. The trackpad of claim 12, wherein the bending beam sensor comprises a carrier, the first pair of strain gauges and the second pair of strain gauges being placed on the carrier.

15. The trackpad device of claim 12, wherein each beam is configured to bend near the second free end of the beam such that the second free end is angled from the first end of the beam.

16. A trackpad for a laptop computer, comprising:
a platform;
at least one bending beam supporting the platform and defining a cantilevered structure having a first end and a second free end extending from a rigid support;
at least one force sensor disposed on the at least one bending beam, the force sensor operative to measure a force exerted on the platform;
a position sensor attached to the platform and configured to detect a location of the force on the platform; and
a deformable substance elastically coupling the platform to the at least one bending beam, wherein
the at least one force sensor is operative to output at least three distinct force levels.

17. The trackpad of claim 16, further comprising a position sensor coupled to the platform.

18. The trackpad of claim 17, wherein the at least one force sensor comprises at least one strain gauge, and the position sensor comprises capacitive measuring electrodes.

* * * * *